United States Patent [19]

Hayashi

[11] Patent Number: 5,406,235

[45] Date of Patent: Apr. 11, 1995

[54] HIGH FREQUENCY DEVICE

[75] Inventor: Katsuhiko Hayashi, Chiba, Japan

[73] Assignee: TDK Corporation, Tokyo, Japan

[21] Appl. No.: 225,341

[22] PCT Filed: Dec. 25, 1991

[86] PCT No.: PCT/JP91/01761

§ 371 Date: Jul. 29, 1992

§ 102(e) Date: Jul. 29, 1992

[87] PCT Pub. No.: WO92/12548

PCT Pub. Date: Jul. 23, 1992

Related U.S. Application Data

[63] Continuation of Ser. No. 915,700, Jul. 29, 1992, abandoned.

[30] Foreign Application Priority Data

| Dec. 26, 1990 | [JP] | Japan | 2-414388 |
| Jan. 31, 1991 | [JP] | Japan | 3-031888 |
| Nov. 11, 1991 | [JP] | Japan | 3-294446 |
| Nov. 20, 1991 | [JP] | Japan | 3-304348 |
| Dec. 2, 1991 | [JP] | Japan | 3-317892 |

[51] Int. Cl.$^6$ .................................. H01P 1/20
[52] U.S. Cl. .................................. 333/204; 333/202
[58] Field of Search ............... 333/202, 204, 222, 246, 333/33, 321

[56] References Cited

U.S. PATENT DOCUMENTS

| 4,603,311 | 7/1986 | Mage | 333/202 |
| 4,853,660 | 8/1989 | Schloemann | 333/204 |
| 4,916,582 | 4/1990 | Okamura et al. | 361/321 |
| 4,918,570 | 4/1990 | Okamura et al. | 361/321 |
| 4,922,325 | 5/1990 | Smeltz, Jr. | 333/260 |
| 5,124,676 | 6/1992 | Ueno | 333/206 |
| 5,160,905 | 11/1992 | Hoang | 333/200 |
| 5,184,095 | 2/1993 | Hanz et al. | 333/33 |
| 5,196,813 | 3/1993 | Nakakubo | 333/246 |
| 5,216,394 | 6/1993 | Konishi et al. | 333/222 |
| 5,227,749 | 7/1993 | Raguenet et al. | 333/246 |

FOREIGN PATENT DOCUMENTS

| 50-151445 | 12/1975 | Japan . |
| 61-100002 | 5/1986 | Japan . |
| 62-86905 | 4/1987 | Japan . |
| 63-209305 | 8/1988 | Japan . |
| 2-290303 | 11/1990 | Japan . |

OTHER PUBLICATIONS

"Microwave Circuit Using Strip Line", Yunoki, Fuji, vol. 12, No. 2, May 25, 1961, pp. 49–51.

Primary Examiner—Raymond A. Nelli
Attorney, Agent, or Firm—Nikaido, Marmelstein, Murray & Oram

[57] ABSTRACT

The present invention relates to high frequency devices, such as a high frequency transmission line, a high frequency filter, and a resonator, and has an object to realize a reduction in size of the high frequency devices without decreasing Q thereof. In order to achieve this object, the high frequency device is structured such that an inner conductor (5) used in a resonator is sandwiched by high dielectric layers (2, 3) of a material with a high dielectric constant, both sides of the high dielectric layers are sandwiched by low dielectric layers (1, 4) of a material with a low dielectric constant, and both sides of the low dielectric layers are sandwiched by GND electrode (6, 7).

8 Claims, 22 Drawing Sheets

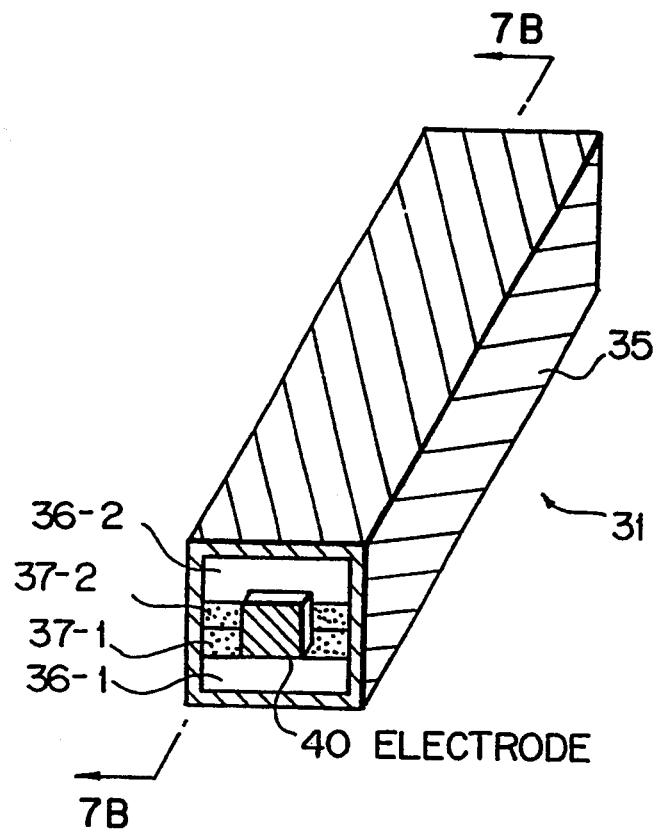
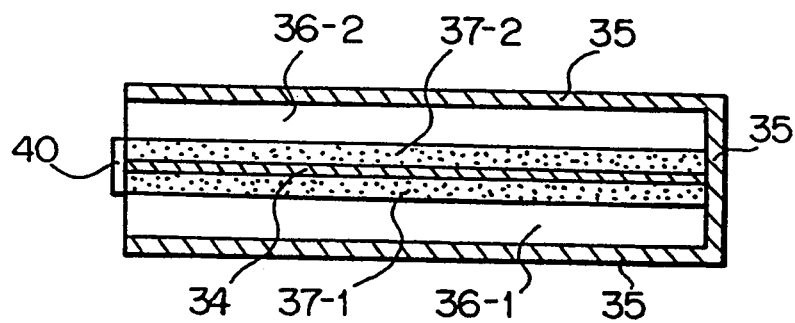

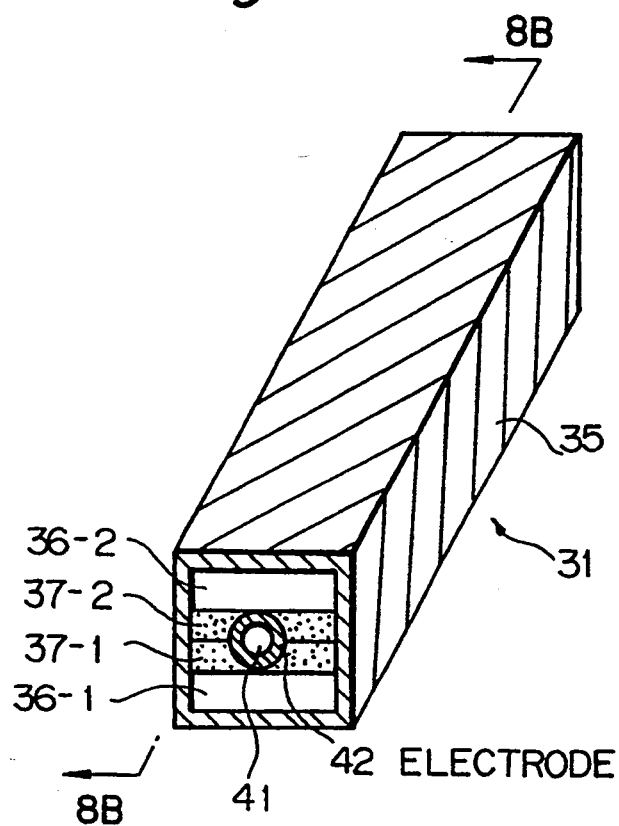
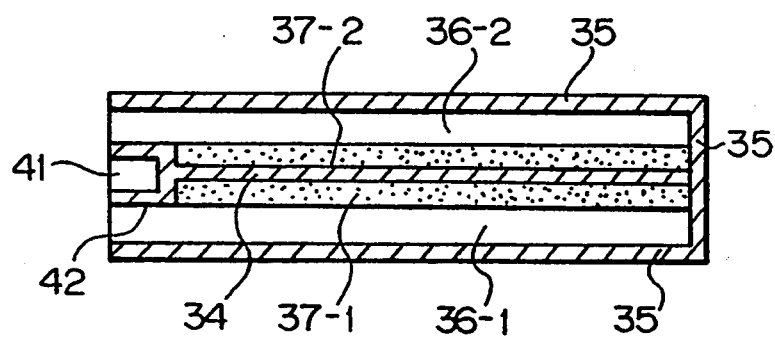

116 GND ELECTRODE
(WIDE-AREA-
CONTACT GROUND)

116 GND ELECTRODE
(WIDE-AREA-
CONTACT GROUND)

OSCILLATOR SECTION   BUFFER SECTION

HIGH FREQUENCY DEVICE

This application is a continuation of application Ser. No. 07/915,700, filed Jul. 29, 1992, now abandoned.

FIELD OF THE INVENTION

The present invention relates to a high frequency device, such as a high frequency resonator, a high frequency filter, a high frequency oscillator, and a dielectric resonator, used in radio equipment or other communication equipments.

BACKGROUND OF THE INVENTION

Various types of high frequency devices have been conventionally used in wireless equipment including portable or cordless telephones, or other communication equipments.

These high frequency devices include a high frequency filter, high frequency oscillator, dielectric resonator, high frequency amplifier, or duplexer.

Hereinafter, examples of the conventional high frequency devices will be described with reference to the accompanying drawings.

PRIOR ART EXAMPLE 1

High frequency transmission line (refer to FIGS. 17A to 17C)

FIGS. 17A to 17C are diagrams showing a conventional high frequency transmission lines, in which FIG. 17A shows a microstrip line, FIG. 17B a suspended microstrip line, and FIG. 17C an inverted microstrip line. Those are used as high frequency signal transmission lines on circuit boards or as parts in delay lines.

In FIGS. 17A to 17C, reference numeral 100 denotes an outer conductor, 102 a dielectric, 103 an inner conductor, and 104 a clearance.

Conventionally, microstrip lines, shown in FIGS. 17A to 17C, have been used for the high frequency transmission lines. Among them, the microstrip line structured as shown in FIG. 17A is generally most extensively used.

This microstrip line has an inner conductor (conductor used as a signal line) 103 provided on one side of a dielectric 102, and an outer conductor (conductor normally used as GND electrode) 101 provided on the other side (side opposite the inner conductor 103) of the dielectric 102.

The reason why this microstrip line structured as described is widely used is because it is smaller and less expensive and easier to manufacture than other microwave circuits such as wave guide circuits when it is used in forming a flat high frequency circuit, for example.

However, the microstrip line mentioned above notably suffers general losses in the transmission line (e.g., radiation loss, dielectric loss, and conductor loss). In order to reduce the losses, improved products have been developed, which include the suspended microstrip line shown in FIG. 17B and the inverted microstrip line shown in FIG. 17C.

The suspended microstrip line, as depicted in FIG. 17B, has the inner conductor and dielectric suspended by a support member to provide a clearance 104 between the dielectric 102 and the outer conductor 101.

The inverted microstrip line has the inner conductor 103 provided on one side of the dielectric 102, which side faces the outer conductor 101 and provides a clearance 104 between the dielectric 102 and the outer conductor 101 as shown in FIG. 17C.

The prior-art microstrip lines have problems described in the following.

(1) In contrast to the ordinary microstrip line, the suspended microstrip line or inverted microstrip line is a transmission line with reduced loss, but it is necessary to form the inner conductor as a signal line by patterning on the dielectric and have the inner conductor overhang separated from the outer conductor which is GND conductor. Therefore, its setting is unstable and its manufacture is difficult.

(2) The suspended microstrip line and the inverted microstrip line, for the structural reason, need to have the outer conductor (GND conductor) more than a certain extent wider than the width of the inner conductor (signal line). This makes it difficult to miniaturize the line.

PRIOR ART EXAMPLE 2

High frequency filter (refer to FIGS. 18A and 18B and FIGS. 19A to 19C)

FIGS. 18A and 18B show examples of high frequency filters, and FIGS. 19A to 19C show equivalent circuits of the high frequency filter of FIGS. 18A and 18B.

In FIGS. 18A and 18B and FIGS. 19A to 19C, reference numeral 111 denotes a substrate (dielectric), 112 and 113 $\lambda/4$ type strip resonators, 114 a coupling capacitor, 115 throughholes, 116 GND electrodes (wide-area-contact grounding metals), 117 and 118 $\lambda/4$ type dielectric resonators, IN input terminals, OUT output terminals, C1 to C4 capacitors, and L1 to L3 coils.

Various types of high frequency filters have been known. Out of them, band pass filters will be described with reference to FIGS. 18A and 18B, in which FIG. 18A shows a strip line filter, and FIG. 18B shows a dielectric filter.

As shown in FIG. 18A, two $\lambda/4$ type strip resonators 112 and 113 are provided a certain distance apart from each other on one side of the substrate 111 (dielectric) 111, a coupling capacitor 114 is connected between those resonators, and a GND electrode (wide-area-contact grounding metal) 116 is formed on the other side of the substrate 111. At the end of each of the two $\lambda/4$ type strip resonators 112 and 113, there is provided a through-hole 115 to connect the resonator 112 to the GND electrode 116.

The dielectric filter is structured as shown in FIG. 18B. More specifically, two $\lambda/4$ type dielectric resonators 117 and 118 are arranged side by side and covered respectively with a GND electrode (wide-area-contact grounding metal), and a coupling capacitor 114 is placed in the middle to connect those dielectric resonators 117 and 118.

The two $\lambda/4$ type dielectric resonators 117 and 118 are coaxial type dielectric resonators which each include a conductor and are covered over their circumferential surface with a GND electrode 116.

An equivalent circuit of the high frequency filter (band pass filter) as mentioned above is shown in FIG. 19A. As depicted in FIG. 19A, the $\lambda/4$ type strip resonators 112 and 113, and the $\lambda/4$ type dielectric resonators 117 and 118 in FIGS. 18A and 18B are equivalent to a parallel resonance circuit with L1 and C1 and a parallel resonance circuit with L2 and C2, respectively.

The high frequency filters such as these are sometimes added with a coil or capacitors. Equivalent circuits of the high frequency filters with the additional coil and capacitors may be as shown in FIGS. 19B and 19C, respectively (e.g., a polarized band pass filter, and a band rejection filter).

FIG. 19B is an example in which a coil L3 is connected in parallel with the coupling capacitor 114. FIG. 19C is an example in which capacitors C3 and C4 are added to the circuit in FIG. 19A.

The prior-art high frequency filters as mentioned above have problems listed below.

(1) In the case of the strip line filter as shown in FIG. 18A, the λ/4 type strip resonators used as signal line suffer a great radiation loss.

Since it is necessary to provide some distance between the λ/4 type strip resonators to prevent mutual interference, the width of the filter, above all else, has to be wide.

(2) In the case of a dielectric filter shown in FIG. 18B, the volume is large, so that a vexing problem is its occupied space in the whole volume of equipment in which it is mounted (particularly with mobile radio equipment).

(3) The high frequency filters shown in FIGS. 18A and 18B have resonators in two stages. In practice, high frequency filters are structured in many more stages, and therefore, invariably become large-sized filters. This makes it difficult to meet the general requirement for miniaturization of devices.

(4) When the high frequency filters shown in FIGS. 18A and 18B are added with a coil or capacitors as shown in FIG. 19B or 19C, the high frequency filters become large-sized filter blocks.

PRIOR-ART EXAMPLE 3

Dielectric resonator (refer to FIGS. 20A and 20B)

FIGS. 20A and 20B show a prior-art dielectric resonator (λ/4 type), in which FIG. 20A is a perspective view and FIG. 20B is a sectional view taken along the line X-Y.

In FIGS. 20A and 20B, reference numeral 121 denotes a dielectric resonator, 122 a dielectric, 123, a through-hole, 124 a resonant conductor, and 125 a GND electrode.

As for the external appearance, the prismatic and columnar dielectric resonators have been known. Out of these two types, a prismatic one is shown in FIGS. 20A and 20B. As shown in the figures, the dielectric resonator 121 has the through-hole 123 formed in the center in the longitudinal direction of the dielectric 122. The GND electrode 125 is formed by covering the all sides of the dielectric 122, except for one of two sides having an opening of the through-hole 123 with a conductor.

The internal circumferential surface of the through-hole 123 is covered with a resonant conductor 124, one end of which is integral with the GND electrode 125. The other end of the resonant conductor 124 which is not integral the GND electrode 125 is so formed as to be used for connection with an external terminal (not shown).

The prior-art dielectric resonator has problems enumerated below.

(1) This dielectric resonator is made in a small size by using a dielectric with high dielectric constant which causes wavelength at the resonance-frequency to be shortened. However, since the resonant conductors are on one side exposed to the space (internal space of the through-holes), the resonant conductor length is not shortened to $\lambda/4\sqrt{\epsilon_r}$ (where $\lambda$ denotes the signal wavelength and $\epsilon_r$ denotes the dielectric constant).

(2) As the dielectric constant $\epsilon$, or the material constant of the dielectric becomes large, the C component (capacitance component) of the resonator becomes large for its structural reasons. Therefore, the line impedance of the resonator decreases, so that the Q of the resonator decreases. Therefore, the prism needs to be made thicker for greater $\epsilon$. Hence, this is another point which makes miniaturization difficult. Also, it is difficult to make a resonator in small size with high Q.

PRIOR-ART EXAMPLE 4

Dielectric filter (refer to FIGS. 21A and 21B)

FIG. 21A and 21B show a prior-art dielectric filter, in which FIG. 21A is a perspective view taken from the top side, while FIG. 21B is a perspective view taken from the reverse side.

In those figures, the same reference numerals as in FIGS. 20A and 20B denote the same components. Reference numeral 126 denotes slots.

An example of conventional dielectric filter is shown in FIGS. 21A and 21B. This dielectric filter is a kind of the band pass filter, and includes a plurality of ¼ wavelength resonant conductors. The above-mentioned resonant conductors constitute resonators, respectively.

As illustrated, a dielectric filter 121 comprises a dielectric 122, a plurality of through-holes 123, resonant conductors 124 covering the internal circumferential surfaces of the through-holes 123, and a GND electrode 125 covering the whole external circumferential surfaces of the dielectric 122 except for one side of the dielectric 122 (the side where there is the resonant conductors 124).

The dielectric 122 has slots 126 formed therein. By those slots 126, the resonant conductors 124 are separated and the coupling among the resonant conductors 124 is adjusted. The GND electrode 125 is provided also on the internal surfaces of the slots 126. On the side where the slots 126 are provided, the resonant conductors 124 and the GND electrode 125 are connected (GND side ends of resonant conductors 124 are commonly connected with each other).

The plurality of resonant conductors 124 (four resonant conductors in this case) have different lengths (some resonant conductors may have the same length) so as to have different resonance frequencies with each other.

Such dielectric filter 122 is made in a manner described below, for example. First of all, a dielectric 122 is produced with through-holes 123 and slots 126 provided by press forming. Then, all sides (including the internal surfaces of the through-holes 123) except for one side where there exist the through-holes 123 are metallized.

The conductor formed inside the through-holes 123 is used as the resonant conductors 124, and the conductor formed on the external circumferential surface of the dielectric 122 is used as the GND electrode 125.

The prior-art dielectric resonator has problems enumerated below.

(1) The above-mentioned dielectric resonator is a dielectric filter which is made in a small size by using a dielectric having high dielectric constant as the dielectric component, causing wavelength at the resonance frequency to be shortened. However, since the resonant conductors are on one side exposed to the space (space in the through-holes), the resonant conductor length is not shortened to $\lambda/4\sqrt{\epsilon_r}$ (where $\lambda$ denotes signal wavelength, $\epsilon_r$ denotes dielectric constant). Thus, there is a limitation to miniaturization of the dielectric filter structured as described above.

(2) The larger the dielectric constant $\epsilon$, or the material constant of the dielectric, the larger the C component (capacitance component) of the resonator becomes for structural reasons.

Therefore, the line impedance of the resonator decreases, so that the Q of the resonator decreases, too. Hence, the resonator must be made thicker in the through-thickness direction for greater $\epsilon$ to prevent the input impedance from decreasing.

PRIOR-ART EXAMPLE 5

VCO (Voltage Control Oscillator, refer to FIGS. 22A to 22C and FIGS. 23A and 23B)

FIGS. 22A to 22C show explanatory diagrams of the prior-art example, in which FIG. 22A is a circuit example of the VCO (voltage control oscillator), FIG. 22B is an explanatory diagram of the microstrip line, and FIG. 22C is an explanatory diagram of the tri-plate type strip line.

FIGS. 23A and 23B show two examples of prior-art VCO modules. FIG. 23A is a perspective view of first example of the VCO module, while FIG. 23B is an exploded view in perspective of second example of the VCO module.

In the figures, R11 to R18 denote resistors, C11 to C21 denote capacitors, L11 and L12 denote coils, CV denotes a varactor diode (variable capacitance diode), SL denotes a strip line, CT denotes a control voltage input terminal, OUT denotes an output terminal, Vcc denotes a power supply, and Tr1 and Tr2 denote transistors.

Reference numerals 131 and 131-1 to 131-3 denote dielectric layers, 132 denotes a resonant conductor, 133 and 133-1 to 133-2 denote GND electrodes, 134 denotes parts (discrete parts), 135 denotes a through-hole, and 136 denotes a blank area.

As an oscillator, VCO (Voltage Control Oscillator) shown in FIG. 22A, for example, has hitherto been known.

This VC0 comprises an oscillator section and a buffer section, which are coupled through the coupling capacitor C17.

In this example, the oscillator section includes the transistor Tr1, the strip line SL, the varactor diode (variable capacitance diode) CV, the capacitors C11 to C16, the resistors R11 to R14, and the coil L11. The buffer section includes the transistor Tr2, the capacitors C18 to C21, the resistors R15 to R18, and the coil L12.

When a control voltage is applied to the control voltage input terminal of the oscillator, the oscillator oscillates at a frequency corresponding to the control voltage, and supplies an output signal of the VCO from the output terminal OUT.

Meanwhile, the above-mentioned strip line SL constitutes a resonator (strip line resonator), and how it is mounted on the substrate is shown by examples in FIGS. 22B and 22C.

FIG. 22B shows as an example of a microstrip line made by forming a resonant conductor 132 on the front surface of the dielectric layer 131 constituting the substrate, and forming a GND pattern on the back side thereof. FIG. 22C shows as an example a tri-plate type strip line which contains the resonant conductor 132 in a multi-layer substrate, and which is sandwiched by the GND patterns 133-1 and 133-2.

FIG. 23A shows the first example of VCO module including a microstrip line formed as depicted in FIG. 22B. This VCO module has the resonant conductor 132 (thick film printing) formed on the front surface of the dielectric layer 131 constituting the substrate (a single substrate or a multi-layer substrate) and parts 134 (discrete parts) such as transistors and resistors mounted thereon. The GND pattern 133 (thick film printing) is formed on the back surface of the above-mentioned dielectric layer 131.

FIG. 23B shows the second example of VC0 module including a strip line formed as depicted in FIG. 22C. This module has parts 134 (discrete parts) such as transistors and resistors mounted on the first dielectric layer 131-1 constituting a multi-layer substrate, and the GND pattern 133-1 formed on the second dielectric layer 131-2, the resonant conductor 132 on the third dielectric layer 131-3, and the GND pattern 133-2 formed on the back side of the third dielectric layer 131-3.

Further, the blank area 136 (an area devoid of a conductor) is provided in a part of the GND pattern 133-1, in the middle of which the through-hole electrode 135 is provided. The resonant conductor 132 and the parts 134 are connected through a blind through-hole (filled with a conductor) using the through-hole electrode 135 as a connection point.

The above-mentioned prior-art has problems enumerated below.

(1) In the resonator (refer to FIG. 22B) in the VCO module of FIG. 23A, the structure allows the capacitance component to be made small, this the line impedance Zo ($Zo°C.\sqrt{L/C}$) of the resonator can be made small. Generally, if capacitance component of the transmission line is denoted by C, inductance component by L, series resistance of the transmission line by $r_s$, and signal wavelength in physical media by $\lambda g$, Q of the transmission line can be expressed by the following formula.

$$Q = (\pi/\lambda g) \cdot (2Zo/r_s)$$

Therefore, when the line impedance Zo is large as mentioned above, the Q of the transmission line can be made high.

The resonant conductor is formed in the surface of the substrate and has nothing present thereon, so that it can be easily adjusted by trimming, for example, and therefore the substrate can be made thin.

However, since a half of the resonant conductor is exposed to the air, the wavelength is not shortened to $\lambda/\sqrt{\epsilon_r}$ ($\lambda$ denotes signal wavelength, $\epsilon_r$ denotes dielectric constant). As it is known when the whole circumference of the resonant conductor is covered with a dielectric with a relative dielectric constant of $\epsilon_r$, the wavelength is shortened as much as $\lambda/\sqrt{\epsilon_r}$. In this case, because the wavelength is not shortened to $\lambda/\sqrt{\epsilon_r}$, the resonant conductor length has to be long. Accordingly, the series resistance component ($r_s$) of the resonant conductor becomes large and the Q deteriorates. Furthermore, owing to the large space factor, the VCO module becomes large in size. As a result, it is difficult to obtain a resonator in small size with high Q.

(2) In the resonator (refer to FIG. 22C) in the VCO module of FIG. 23B, for structural reasons the C (capacitance) component is likely to become large (the capacitance component exists between the resonant conductor and the two outer GND patterns), thus the line impedance Zo of the resonator is hard to increase and the Q tends to become low. Consequently, it is necessary to make the dielectric layers on both sides of the resonant conductor, with the result that the VCO module becomes thick.

On the other hand, since the resonant conductor is contained between the dielectric layers, it is expected that a wavelength is shortened to $\lambda/\sqrt{\epsilon_r}$. The series resistance ($r_s$) can be decreased in proportion to the amount by which the resonant conductor is shortened, and therefore, the Q becomes high.

However, since the dielectric conductor is contained in the dielectric layers, it is difficult to adjust the resonator.

SUMMARY OF THE INVENTION

The present invention has been made to solve the above problems, and has as its object to reduce in size a high frequency device by using a plurality of dielectric layers having different dielectric constants in combination, and thereby increasing the line impedance without decreasing Q.

According to the present invention, it is possible to provide high frequency devices as described below.

(1) A high frequency device comprises, on a multilayer substrate constituted by laminating a plurality of dielectric layers (1, 2, 3, 4) with different dielectric constants ($\epsilon_1$, $\epsilon_2$; $\epsilon_1 > \epsilon^2$), at least an inner conductor (5) as a signal transmission line for propagating a high frequency signal, and outer conductors (6, 7) for providing a ground potential (GND), wherein, in the laminated direction of the dielectric layers, both sides of the inner conductor (5) is sandwiched by high dielectric layers (2, 3) formed of a dielectric material with a high dielectric constant ($\epsilon_1$), both sides of the high dielectric layers are sandwiched by low dielectric layers (1, 4) formed of a dielectric material with a low dielectric constant ($\epsilon_2$), and both sides of the low dielectric layers are sandwiched by outer conductors (6, 7).

(2) A high frequency filter comprises, a laminated body constituted by laminating at least first to fourth dielectric layers (1 to 4), first and second resonant conductors (9, 10) formed at intervals of a predetermined distance at the laminating surfaces of the second and third dielectric layers (2, 3) located in the center portion of the laminated body, GND electrodes (11) formed at intervals of a predetermined distance between the resonant conductors, and GND electrodes (6A, 7A) formed on outer surfaces of the first and fourth dielectric layers (1, 4) formed, in the laminated direction, on both sides of the dielectric layers, wherein the second and third dielectric layers (2, 3) are made of a material with a high dielectric constant ($\epsilon_1$), and the first and fourth dielectric layers (1, 4) formed between the second and third dielectric layers and the outside GND electrodes (6A, 7A) made of a material with a dielectric constant ($\epsilon_2$; $\epsilon_2 < \epsilon_1$) lower than that of the second and third dielectric layers (2, 3).

(3) A high frequency filter comprises, a laminated body constituted by laminating at least first to eighth dielectric layers (1A to 4B), a GND electrode (6A) formed on an outer surface of the uppermost first dielectric layer (1A), first resonant conductors (9) at the laminating surfaces of the second and third dielectric layers (2A, 3A) located below the GND electrode (6A), GND electrode patterns (11A) formed at intervals of a predetermined distance between the resonant conductors (9), a GND electrode (7C) formed at the laminating surfaces of the fourth and fifth dielectric layers (4A, 1B) below the third dielectric layer, second resonant conductors (10) at the laminating surfaces of the sixth and seventh dielectric layers (2A, 3B) below the fifth dielectric layer, GND electrodes (11B) formed at intervals of a predetermined distance between the resonant conductors (10), and a GND electrode (7A) formed on an outer surface of the lowermost eighth dielectric layer (4B) below the seventh dielectric layer, wherein the second, third, sixth and seventh dielectric layers (2A, 3A, 2B, 3B) formed on both sides of the respective resonant conductors (9, 10) are made of a material with a high dielectric constant ($\epsilon_1$) and the dielectric layers (1A, 4A, 1B, 4B) between the outside and central GND electrodes (6A, 7A, 7C) are made of a material with a dielectric constant ($\epsilon_2$; $\epsilon_2 < \epsilon_1$) lower than that of the high dielectric layers (2A, 3A, 2B, 3B).

(4) A dielectric resonator comprises, a laminated dielectric block constituted by laminating low dielectric layers (36-1, 36-2) and high dielectric layers (37-1 to 37-3), resonant conductors (34, 34-1, 34-2) formed inside the dielectric block, and a GND electrode (35) formed at the whole external circumferential surface of the dielectric body except for one side thereof, wherein the high dielectric layers (37-1 to 37-3) are formed on both sides, in the laminated direction, of the resonant conductors (34, 34-1, 34-2), and low dielectric layers (36-1, 36-2) are formed between the high dielectric layers and the GND electrode (35).

(5) A dielectric filter comprises, a laminated body constituted by laminating low dielectric layers (56-1, 56-2) and high dielectric layers (57-1, 57-2) with a dielectric constant higher than that of the low dielectric layers, a plurality of resonant conductors (54-1 to 54-4) having different resonance frequencies and formed inside the laminated body, and a GND electrode (55) provided at the whole external circumferential surface of the laminated body except for one side thereof, wherein the high dielectric layers (57-1, 57-2) are formed on both sides, in the laminated direction, of the resonant conductors (54-1 to 54-4), and the low dielectric layers (56-1, 56-2) are formed between the high dielectric conductors (57-1, 57-2) and the GND electrodes (55) disposed on both sides, in the laminated direction.

(6) A dielectric filter as above-described, wherein between the plurality of resonant conductors (54-1 to 54-4), low dielectric strips (61) having a dielectric constant lower than that of the high dielectric layers (57-1, 57-2) formed on both sides of the resonant conductors are formed, respectively.

(7) A dielectric filter as above-described, wherein a plurality of holes (62) are formed in the high dielectric layers (57-1, 57-1) disposed on both sides of the resonant conductors at positions corresponding to the areas between the resonant conductors, and the holes (62) are filled with a dielectric having a dielectric constant lower than that of the high dielectric layers.

(8) An oscillator module comprises, a resonant conductor (72) constituting a strip line resonator, high dielectric layers (71-4H, 71-5H) sandwiching both sides of the resonator conductor (72), low dielectric layers (71-3L, 71-6L) sandwiching both sides of the high dielectric layers, and a GND patterns (73-1A, 73-2) formed on both sides of the dielectric layers except for a certain part, wherein, in the laminated direction of the dielectric layers, the GND pattern (73-2) is formed, through the intermediary of the dielectric layers (71-5H, 71-6L), on one side (under side) of the resonant conductor (72), and dielectric layers (71-1L, 71-2L) are formed on the other side (upper side) of the resonant conductor (72) at a portion facing the resonant conductor, without forming a GND pattern.

The above-mentioned high frequency devices have the functions and effects as described below.

For resonators such as a dielectric resonator, generally, Q under unloaded (denoted as Qu) is defined by the following equation.

$$\frac{1}{Qu} = \frac{1}{Qc} + \frac{1}{Qd} + \frac{1}{Qr} \tag{1}$$

where Qc denotes Q by a transmission line conductor, Qd denotes Q by a dielectric, and Qr denotes Q by radiation.

Meanwhile, in a coaxial resonator, 1/Qr is normally disregarded, so that the equation (1) will be reduced to:

$$\frac{1}{Qu} = \frac{1}{Qc} + \frac{1}{Qd} \tag{2}$$

By using the series resistance component r of the transmission line conductor and the line impedance Zo of the transmission line, Qc can be expressed as follows.

$$Qc = 2\pi Zo/r_s \tag{3}$$

Also, by using a relative dielectric constant $\epsilon_r'$ and the dielectric loss $\epsilon_r''$, Qd can be expressed as follows.

$$Qd = \epsilon_r'/\epsilon_r'' \tag{4}$$

From the equations (2), (3) and (4), it is understood that in order to increase the Q under unloaded (Qu) of the resonator, it is necessary to (1) increase the line impedance Zo and the relative dielectric constant $\epsilon_r'$.

(2) decrease the series resistance component $r_s$ and the relative dielectric loss $\epsilon_r''$.

If the relative dielectric constant $\epsilon_r'$, above all else, is increased, naturally, the wavelength shortening occurs which is expressed by the following formula and the resonant conductor length of a λ/4 type resonator can be expressed by the formula $\lambda/4\sqrt{\epsilon_r}$.

Therefore, the series resistance component $r_s$ decreases, and both Qc and Qd increase. As a result, Q under unloaded (Qu) increases, too.

Meanwhile, according to the above-mentioned structure in the present invention, the resonant conductor (inner conductor) is pinched by high dielectric layers (dielectric layers with high dielectric constant) from both sides of the laminated direction, and no portion of the resonant conductor is exposed to the space as in the prior art, so that the resonant conductor length can be shortened to $\lambda/4\sqrt{\epsilon_r}$ compared with the prior art.

In addition, the presence of the low dielectric layers (dielectric layers with low dielectric constant) between the high dielectric layers and the GND electrode prevents the C component (capacitance component) from increasing even if the thickness of the dielectric resonator in the laminated direction is reduced. Therefore, a large line impedance Zo can be obtained.

In consequence, the wavelength shortening mentioned above permits the dielectric resonator to be shortened in the longitudinal direction. As a result, the series resistance component $r_s$ decreases, Qc increases, and also, Q under unloaded (Qu) increases.

To be more specific, as for the effect of the structure mentioned above, small-size high frequency devices can be produced without reducing the Q of the resonator.

BRIEF DESCRIPTION OF THE DRAWINGS

FIGS. 7A and 7B are diagrams showing a structural example (example 1) of an electrode;

FIGS. 8A and 8B are diagrams showing a structural example (example 2) of the electrode;

DESCRIPTION OF THE PREFERRED EMBODIMENTS

Embodiments of the present invention will be now described with reference to the accompanying drawings.

Description of a first embodiment

Figure 1A:
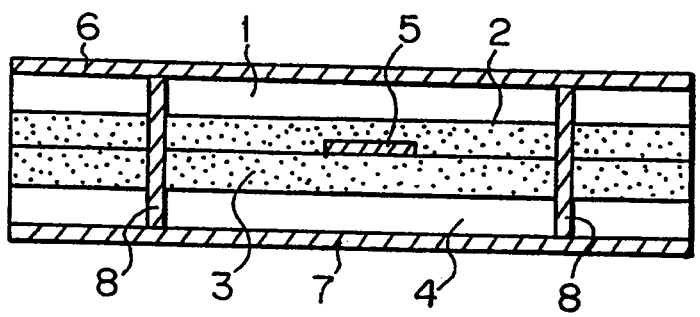
FIGS. 1A and 1B are diagrams showing a high frequency transmission line according to a first embodiment of the present invention.
Figure 1B:
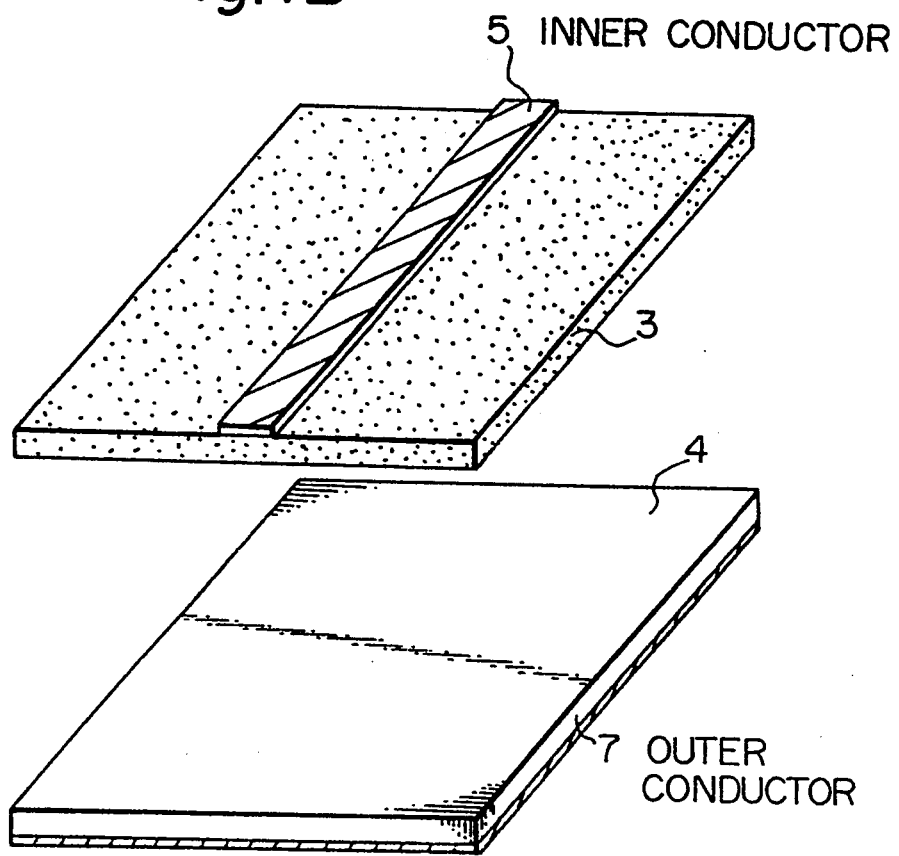

FIGS. 1A and 1B are diagrams showing a high frequency communication line according to a first embodiment of the present invention, in which FIG. 1A is a sectional view of the high frequency communication line, while FIG. 1B is an exploded view in perspective of a part (third and fourth dielectric layers) of FIG. 1A.

In these figures, reference numerals 1 to 4 denote first to fourth dielectric layers of a multi-layer substrate, respectively, 5 denotes an inner conductor, 6 and 7 denote GND electrodes, and 8 denotes blind through-holes (filled with a conductor).

The first embodiment is a case in which a high frequency device according to the present invention is used as a high frequency transmission line in a signal communication line or a delay line.

As shown in the figures, in this embodiment, a multi-layer substrate is formed by laminating first to fourth dielectric layers 1 to 4. In this case, the first dielectric layer 1 and the fourth dielectric layer 4 are made of a material with a low dielectric constant ($\epsilon_2$), and the second dielectric layer 2 and the third dielectric layer 3 are made of a material with a high dielectric constant ($\epsilon_1$, where $\epsilon_1 > \epsilon_2$).

An inner conductor 5 used as a signal transmission line for propagating a high frequency signal is provided on the third dielectric (high dielectric constant) layer 3.

An outer conductor (GND electrode) 6 for giving a ground potential (GND) is provided on the first dielectric (low dielectric constant) layer 1, and another outer conductor (GND electrode) 7 for also giving a ground potential (GND) is provided under the fourth dielectric (low dielectric constant) layer 4.

Furthermore, using blind through-holes (filled with a conductor) 8 provided through the first to fourth dielectric layers 1 to 4, the outer conductors 6 and 7 are connected to make them at the same potential (GND potential).

According to this structure, high dielectric layers 2 and 3 are arranged on both sides of the inner conductor 5 in the laminating direction of the dielectric layers 1 to 4. Low dielectric layers 1 and 4 are arranged on both sides of the high dielectric layers 2 and 3, and on both sides of these low dielectric layers 1 and 4, outer conductors 6 and 7 are arranged, respectively. In this manner, a high frequency transmission line is formed.

In other words, the high frequency communication line is formed in a tri-plate structure by having the inner conductor sandwiched by high dielectric layers, then sandwiched by low dielectric layers, and thereafter sandwiched by outer conductors.

As for the manufacturing method, this high frequency transmission line is made in the same manner as by a method of manufacturing a ceramic multi-layer substrate, for example. For the second and third dielectric layers 2 and 3, a sheet with a relatively high dielectric constant is used. To make the first and fourth dielectric layers, a sheet with a relatively low dielectric constant is used. The dielectric layers 1 to 4 made of those sheets are to be laminated to form a multi-layer substrate.

The inner conductor 5 as the signal line is formed by printing a conductor paste on the third dielectric layer 3, and the outer conductors 6 and 7 (conductors for GND layer, for example) are formed on the outer surfaces of the first and fourth dielectric layers 1 and 4 by solidly printing a conductor paste (printing all over the whole surface).

When the dielectric constant of the second and third dielectric layers 2 and 3 is denoted by $\epsilon_1$ and that of the first and fourth dielectric layers 1 and 4 is denoted by $\epsilon_2$, materials should be selected so that $\epsilon_1 > \epsilon_2$.

For example, the high dielectric constant value $\epsilon_1$ should normally be 10 or larger, preferably 20 or larger, more preferably 30 or larger.

On the other hand, the low dielectric constant value should normally be 20 or smaller, or more preferably 10 or smaller.

As for dielectric materials used for the present invention, dielectric materials of titanic acid family, for example, rutile family, may be used for the high dielectric constant ($\epsilon_1$) material, while $Al_2O_3$, $SiO_2$, forsterite, cordierite may be used for the low dielectric constant ($\epsilon_2$) material.

In the present invention, a combination of those material is selected to meet the condition $\epsilon_1 > \epsilon_2$. Above all, it is desirable to set a large difference between $\epsilon_1$ and $\epsilon_2$.

The inner conductor 5, which serves as a transmission line for a high frequency signal, is formed in the longitudinal direction almost in the center of the surface of the third dielectric layer 3. The inner conductor 5 may have an optional width suitable for the impedance of the signal transmission line.

As described above, in addition to the aforementioned effects of the present invention, this embodiment provides following effects.

(1) A high frequency transmission line with reduced loss can be obtained which is electrically equivalent to the conventional suspended microstrip line or to inverted microstrip line.

(2) Since the conventional laminating technology used for manufacturing a multi-layer substrate can be utilized for manufacturing a high frequency transmission line, the manufacture of high frequency transmission lines is made easy.

(3) The distance between the inner and outer conductors can be set easily and stably because this distance can be set by adjusting the thickness of the low dielectric layers.

(4) If this high frequency transmission line is so structured that the inner conductor is pinched with conductors from left and right or from above and below (in the thickness direction) or pinched from left and right and from above and below, the radiation loss can be further reduced. By this transmission line, a high frequency signal can be transmitted with low loss and high efficiency.

(5) If the above-mentioned method (4) is used, even though the line width is reduced, the radiation loss can be decreased, so that the high frequency transmission line can be made in small size.

(6) For example, when a high frequency transmission line according to the present invention is applied to a resonator, the reduction in size does not cause Q to be decreased.

Description of a second embodiment

Figure 2:
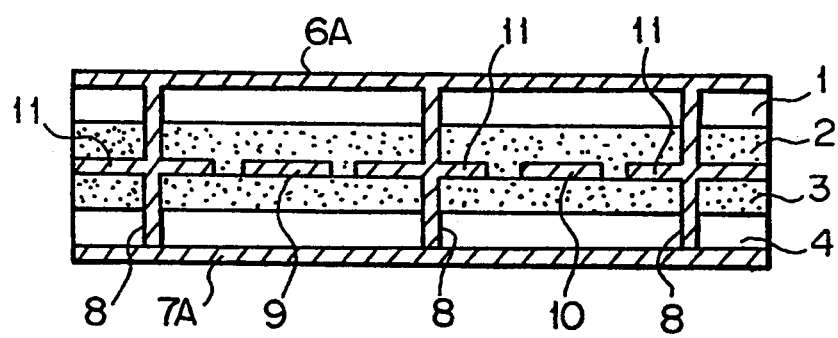
FIG. 2 is a diagram showing a high frequency filter according to a second embodiment of the present invention.

FIG. 2 is a diagram showing a high frequency filter (in sectional view) according to a second embodiment. In FIG. 2, the same reference numerals as in FIGS. 1A and 1B denote the same parts. Reference numeral 9 denotes a first resonant conductor, 10 a second resonant conductor, 11 conductors (GND electrode), and 6A and 7A GND electrodes.

In the second embodiment, the two resonant conductors 9 and 10 (resonant conductors of the strip line resonator) corresponding in function to the inner conductor 5 mentioned above are mounted on the same dielectric layer 3, and the outer conductors 6A and 7A are used as GND electrodes, which are connected with a coupling capacitor to form a high frequency filter (band pass filter).

The multi-layer substrate constituting the high frequency filter according to the second embodiment is formed by using the same dielectric layers as in these multi-layer substrate of the first embodiment.

More specifically, the first and fourth dielectric layers 1 and 4 are formed by low dielectric layers (dielectric constant $\epsilon_2$), and the second and third dielectric layers 2 and 3 are formed by high dielectric layers (dielectric constant $\epsilon_1$, where $\epsilon_1 > \epsilon_2$).

The first and second resonant conductors 9 and 10 are mounted on the third dielectric layer 3, and conductors 11 used as GND electrodes are provided a specified distance apart from each other and as if they surrounded the first and second resonant conductors 9 and 10.

In this case, the first and second resonant conductors 9 and 10 constitute $\lambda/4$ type strip resonators (X is wavelength of high frequency signal), respectively, and they are at one end connected to the above-mentioned conductors 11.

The GND electrodes 6A and 7A are provided on the upper side (outside surface) of the first dielectric layer 1 and on the under side (outside surface) of the fourth dielectric layer 4, and are connected through blind through-holes (filled with a conductor) 8 with the conductors 11, to be used at the same potential.

The first and second resonant conductors 9 and 10 are connected with each other via a capacitor (not shown) contained in the multi-layer substrate. Thus, the capacitor and the resonant conductors constitute a strip line filter.

Description of a third embodiment

Figure 3:
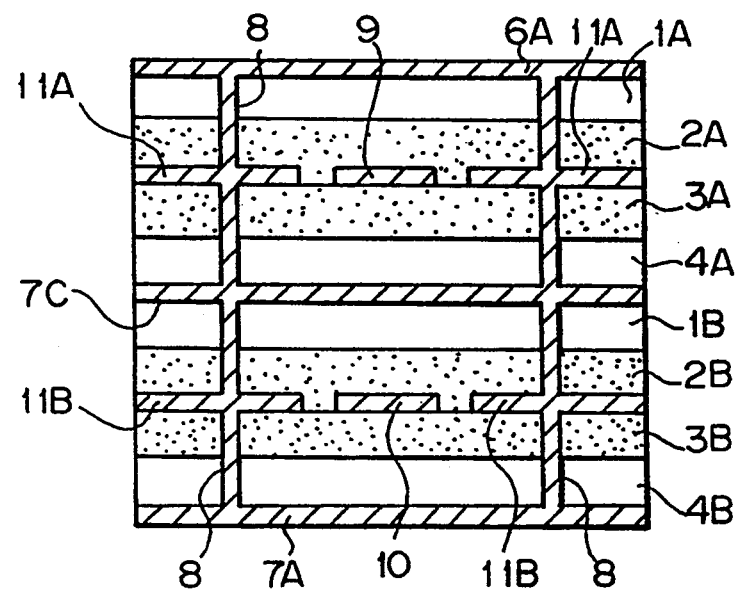
FIG. 3 is a diagram showing a high frequency filter according to a third embodiment of the present invention.

FIG. 3 is a diagram showing a high frequency filter (sectional view) according to a third embodiment. In FIG. 3, the same reference numerals as these in FIGS. 1A to 2 denote the same parts. In FIG. 3, reference numerals 7C, 11A, and 11B denote GND electrodes, and 1A, 2A, 3A, 4A, 1B, 2B, 3B, and 4B denote first to eighth dielectric layers.

This third embodiment is a modification of the second embodiment. However, in this third embodiment, the first and second resonant conductors 9 and 10 are arranged in the laminating direction.

To be more specific, the second, third, sixth and seventh dielectric layers 2A, 3A, 2B, and 3B are all formed of a high dielectric constant material (dielectric constant $\epsilon_1$), and the first, fourth, fifth, and eighth dielectric layers 1A, 4A, 1B, and 4B formed of a low dielectric constant material (dielectric constant $\epsilon_2$) are provided between those high dielectric layers and the GND electrodes 6A, 7C, and 7A.

In this case, materials for the layers are selected to meet the condition $\epsilon_1 > \epsilon_2$. By so doing, the first and second resonant conductors 9 and 10 are respectively placed between the high dielectric layers 2A and 3A, and 2B and 3B. The high dielectric layers are surrounded by low dielectric layers.

As described above, the second and third embodiments offer following effects.

(1) Even when the high frequency filter is reduced in volume and size, the radiation loss can be decreased. Therefore, this makes it possible to produce devices using a high frequency filter in reduced size and weight.

(2) As a high frequency filter is made in a multi-layered structure, if another element, say, a capacitor is to be added, the capacitor can be contained inside by being included when solid printing is performed. Therefore, a high frequency filter can be manufactured easily and in a reduced size.

Description of a fourth embodiment

Figure 4A:
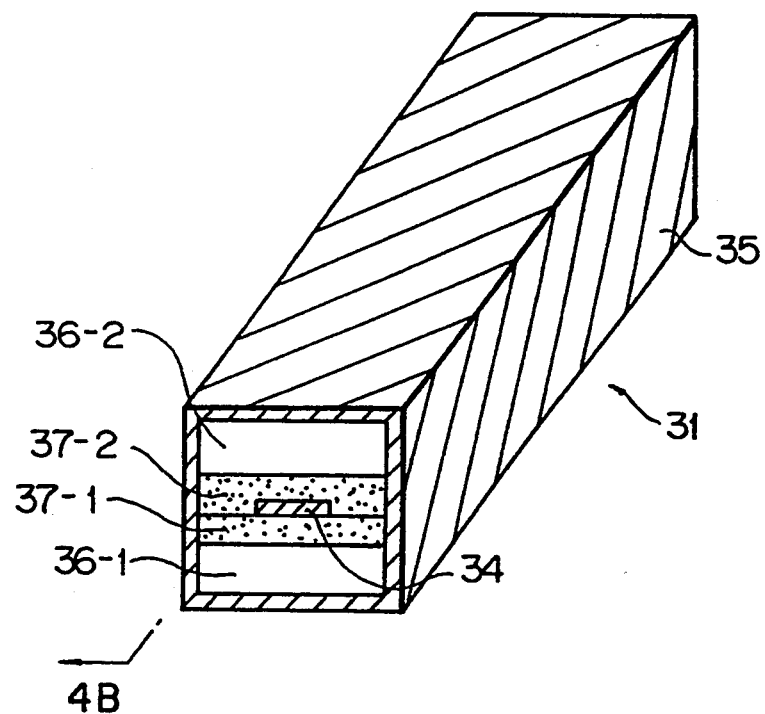
FIGS. 4A and 4B are diagrams showing a dielectric resonator according to a fourth embodiment of the present invention.
Figure 4B:
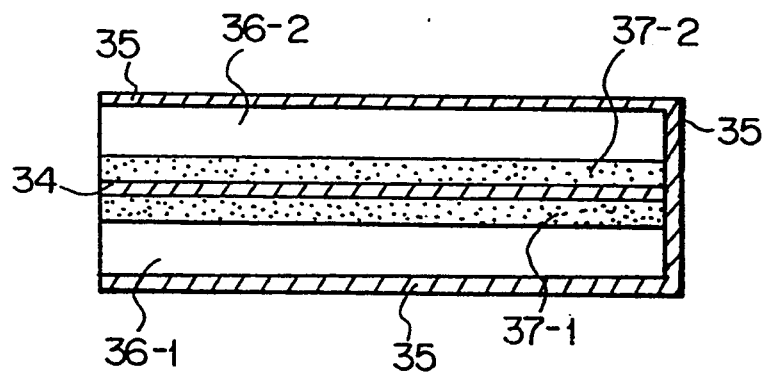

FIGS. 4A and 4B are diagrams showing a dielectric resonator according to a fourth embodiment, in which FIG. 4A is a perspective view of the dielectric resonator and FIG. 4B is a sectional view taken along the line X–Y of FIG. 4A. In the figures, reference numeral 31 denotes a dielectric resonator, 34 a resonant conductor, 35 a GND electrode, 36-1 and 36-2 low dielectric layers, and 37-1 and 37-2 high dielectric layers.

The fourth embodiment is a dielectric resonator constituted by using the resonant conductor 34 corresponding to the aforementioned inner conductor 5, and the peripheral GND electrode 35 as an outer conductor.

As shown in FIG. 4A, this dielectric resonator 31 is prismatic in external appearance, and has the resonant conductor 34 placed in the center along the longitudinal direction. The high dielectric layers 37-1 and 37-2 are provided only around the resonant conductor 34. The low dielectric layers 36-1 and 36-2 are provided between the high dielectric layer 37-1 and the outside GND electrode 35 and between the high dielectric layer 37-2 and the outside GND electrode 35. The high dielectric layers 37-1 and 37-2 should preferably be thinner than the low dielectric layers 36-1 and 36-2.

Unlike with the prior art, this dielectric resonator 31 is made by using laminating technology used for the multi-layer substrate, and therefore, does not have a through-hole present in the prior art.

The dielectric resonator 31 is made in the manner described below, for example. First, a low dielectric layer 36-1 is formed, on which a high dielectric layer 37-1 is laminated.

On the high dielectric layer 37-1, a conductor is printed to form the resonant conductor (thick film pattern) 34.

Then, on the resonant conductor 34, a high dielectric layer 37-2 is laminated, so that the resonant conductor 34 is surrounded at the top, bottom, left and right sides with the high dielectric layers 37-1 and 37-2. In this case, the width of the resonant conductor 34 is made narrower than the high dielectric layers 37-1 and 37-2.

Thereafter, a low dielectric layer 36-2 is laminated on the above-mentioned high dielectric layer 37-2, thereby making the whole laminated body prismatic. Finally, a GND electrode 35 is formed on all sides of the dielectric resonator except for one of two sides where the resonant conductor 34 is exposed. This GND electrode 35 is formed by printing a conductor paste, for example. At this step, the resonant conductor 34 is formed so that one end thereof contacts to the GND electrode 35, as shown in FIG. 4B.

It should be noted that each of the above-mentioned low dielectric layers 36-1 and 36-2 is not limited to one layer, but may be any optional number of layers (multiple layers). Also, each of the high dielectric layers 37-1 and 37-2 may be formed in multiple layers.

As for the layer thickness, the low dielectric layer should preferably be thicker than the high dielectric layer.

Description of a fifth embodiment

Figure 5A:
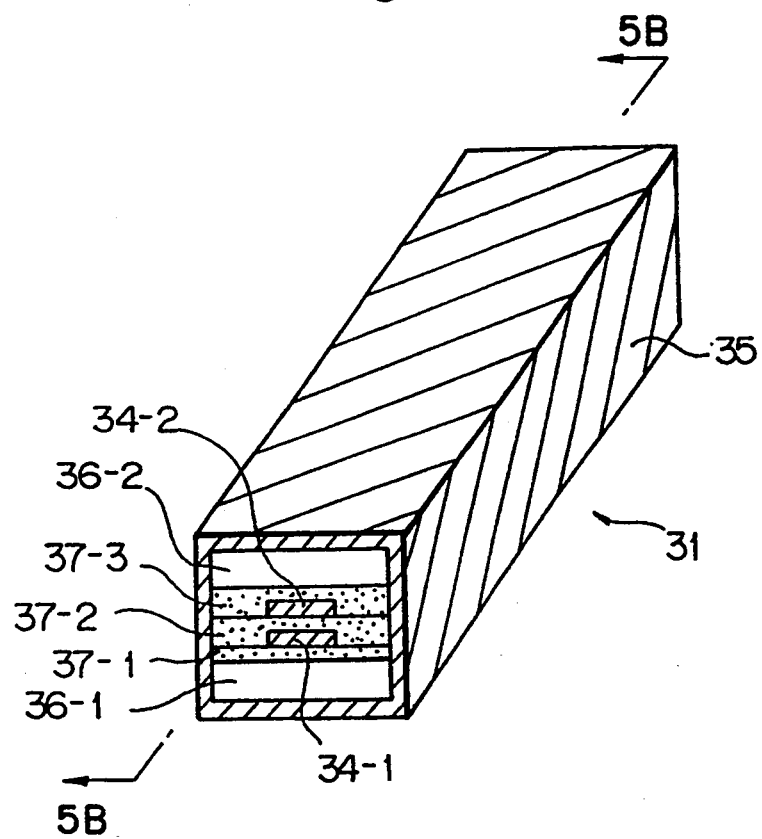
FIGS. 5A and 5B are diagrams showing a dielectric resonator according to a fifth embodiment of the present invention.
Figure 5B:
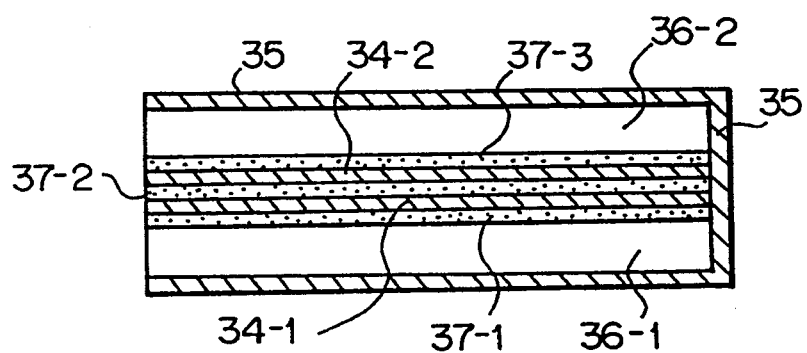

FIGS. 5A and 5B are diagrams showing a dielectric resonator according to a fifth embodiment, in which FIG. 5A is a perspective view of the dielectric resonator, while FIG. 5B is a sectional view taken along the line X-Y of FIG. 5A. In the figures, the same reference numerals as in FIGS. 4A and 4B denote the same parts. Reference numerals 34-1 and 34-2 denote resonant conductors, and 37-1 to 37-3 denote high dielectric layers.

The fifth embodiment was made to reduce the loss of the resonant conductor by using two resonant conductors, and its structure is shown in FIGS. 5A and 5B. Also in this embodiment, the high dielectric layers are disposed only around the resonant conductors.

The dielectric resonator 31 is made in the manner as described below, for example. First, a high dielectric layer 37-1 is laminated on a low dielectric layer 36-1, and then a resonant conductor 34-1 is formed (in thick film pattern) on the high dielectric layer 37-1. Thereafter, a high dielectric layer 37-2 is laminated thereon.

Then, the resonant conductor 34-2 is formed (in thick film pattern) on the high dielectric layer 37-2, and on which a high dielectric layer 37-3 is laminated. Thereafter, a low dielectric layer 36-2 is laminated on the layer 37-3, The whole laminated body is formed in a prismatic shape. Finally, a GND electrode 35 is formed on all external sides of the laminated body except for one of two sides where the resonant conductors 34-1 and 34-2 are exposed, and this GND electrode 35 is connected to one end of each of the resonant conductors 34-1 and 34-2.

It ought to be noted that the other ends of the resonant conductors 34-1 and 34-2 which are not connected to the GND electrode 35 are connected with terminals (electrodes) for connection with an external circuit.

Description of the structural examples of the resonant conductors

FIGS. 6A to 6F show structural examples of the resonant conductors in the above-mentioned fourth and fifth embodiments. In those figures, the same reference numerals as in FIGS. 4A to 5B denote the same parts. Reference numeral 34G denotes the GND terminals, and 38, 38-1 and 38-2 denote the point where the width changes.

As described above, the resonant conductor 34 is formed as a thick film pattern on the high dielectric layer 37-1. The thick film pattern may be formed in various forms as shown in examples 1 to 6. In those figures, the resonant conductor is denoted by reference numeral 34, and the high dielectric layer by 37-1. However, the above-mentioned patterning is applied to the resonant conductors 34-1 and 34-2, and the high dielectric layer 37-2 in the fifth embodiment.

Figure 6A:
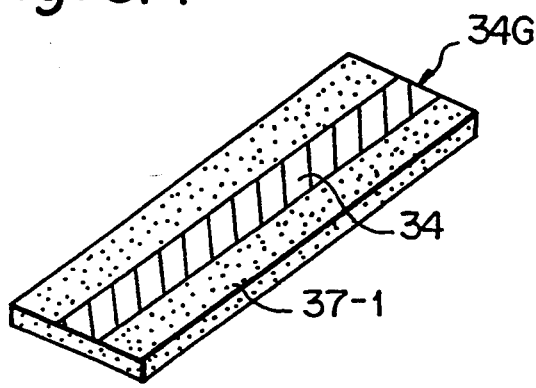
FIGS. 6A to 6F are diagrams showing structural examples of a resonant conductor.

Example 1 in FIG. 6A is a thick film pattern of the resonant conductor 34 in the form of a strip with a fixed width.

Figure 6B:
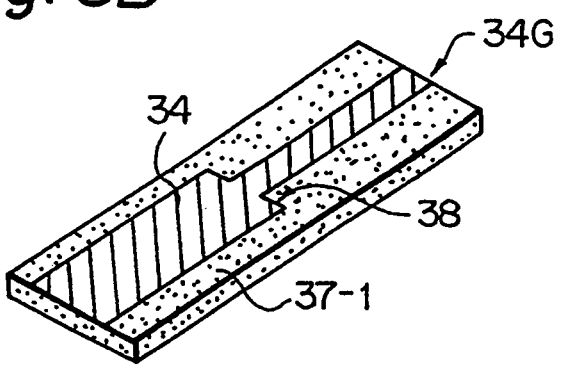

Example 2 in FIG. 6B is a thick film pattern which has a change point 38 of the width in almost the middle of the longitudinal direction of the resonant conductor 34. For the range from this width change point 38 to the GND electrode end 34G, the thick film pattern width is narrow, and for the other range, the width is made wider (the width changes in two stages).

Figure 6C:
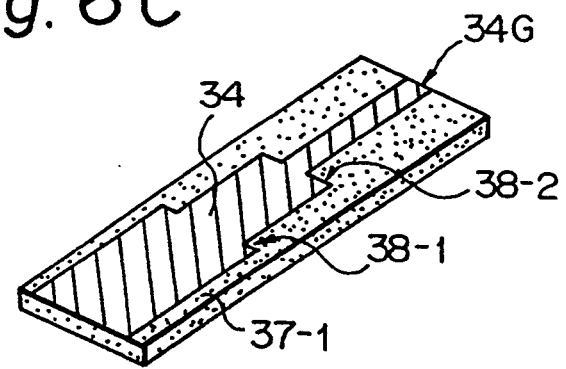

Example 3 in FIG. 6C is a resonant conductor 34 having two width change points 38-1 and 38-2 at which the resonant conductor 34 is divided into three portions with almost equal lengths in the longitudinal direction. As illustrated, for the range from the end of the resonant conductor 34 opposite the GND-side end to the width change point 38-1, the pattern width is widest, for the range between the width change points 38-1 and 38-2, the pattern width is intermediate, and for the range from the width change point 38-2 to the GND-side end 34G, the pattern width is narrowest. In the manner as described, the thick film pattern of the resonant conductor 34 is varied in three stages.

Figure 6D:
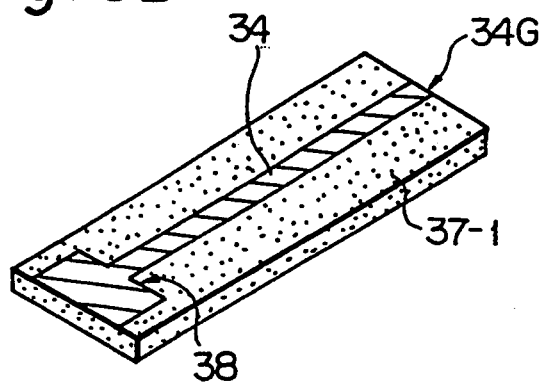

Example 4 in FIG. 6D is a resonant conductor having the width change point 38 near the end thereof with the width wide near that end and narrow from the width change point 38 to the GND-side end 34G.

As shown in Examples 2 to 4, the reason for providing the width change points (points where the resonant conductor width varies in steps is to prevent a harmful resonance in higher modes (harmonic suppress measure).

Figure 6E:
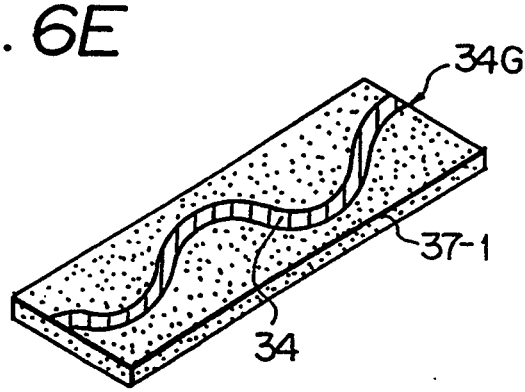

Example 5 in FIG. 6E is a resonant conductor 34 formed by a thick film pattern having a fixed width but meandering. This meandering provides the resonant conductor with a substantially long length, so that the dielectric resonator can be made short in longitudinal length and hence, small in size.

Figure 6F:
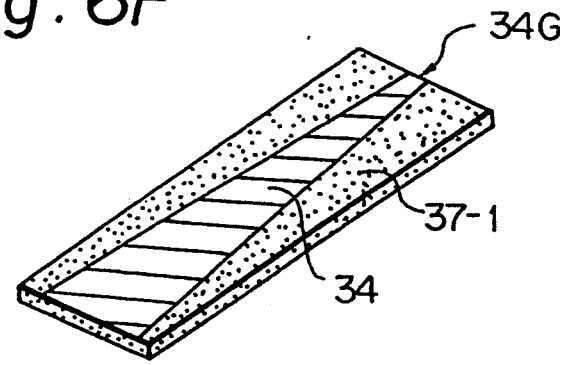

Example 6 in FIG. 6F is a resonant conductor 34 formed by a tapered thick film pattern. As illustrated, the thick film pattern is tapered so that the width is narrowest at the GND-side end 34G and widest at the opposite end.

Description of the structural examples of the electrodes

FIGS. 7A and 7B, FIGS. 8A and 8B, and FIGS. 9A and 9B show structural examples of the electrodes (for external terminals) in the four and fifth embodiment mentioned above. In those figures, the same reference numerals as in FIGS. 4A to 6B denote the same parts. Reference numerals 40, 42, and 43 denote electrodes, and 44 denotes blank areas.

The dielectric resonator 31 shown in the fourth and fifth embodiments mentioned above need to be fitted with electrodes for external terminals, as shown in FIGS. 7A and 7B, FIGS. 8A and 8B, and FIGS. 9A and 9B, for example.

Hereinafter, those examples will be described with reference to FIGS. 7A and 7B, FIGS. 8A and 8B, and FIGS. 9A and 9B. Those examples shown in these figures are structural arrangements applied to the dielectric resonator in the fourth embodiment, but can be applied similarly to the dielectric resonator in the fifth embodiment. FIG. 7A is a perspective view of the dielectric resonator, and FIG. 7B is a sectional view taken along the line X-Y of FIG. 7A.

Example 1 in FIGS. 7A and 7B is a structural example of the dielectric resonator in which a chip-like electrode 40 is mounted almost in the center of the side devoid of the GND electrode 35, connected to the resonant conductor 34.

This electrode 40 is used as a terminal for connection with an external circuit.

Example 2 in FIGS. 8A and 8B is a structural example of the dielectric resonator 31 in which a shallow pit (blind hole) 41 is provided almost in the center of the side without the GND electrode 35, at the internal circumference of which pit 41 an electrode 42 is formed, and the electrode 42 is connected to the resonant conductor 34.

In this case, for example, after the dielectric layers have been laminated, the pit 41 is formed, and then, the conductor of the electrode 42 is attached. Into this electrode 42 formed in the pit 41, a convex electrode, insertable into the electrode 42, is inserted for connection with an external circuit.

It should be noted that in this case, the electrode 42 serving as a female connector is connected detachably to an external electrode (male connector, in this case).

Figure 9A:
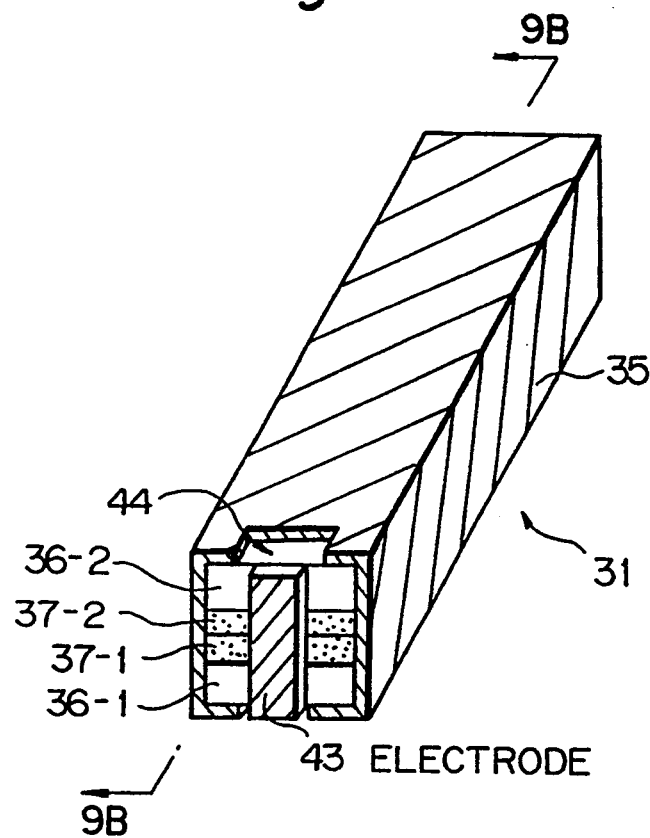
FIGS. 9A and 9B are diagrams showing a structural example (example 3) of the electrode.
Figure 9B:
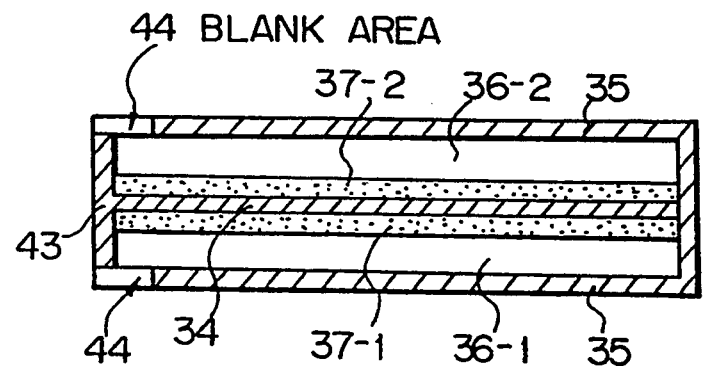

Example 3 in FIGS. 9A and 9B is a structural example made in SMD (surface mounted device) application. As illustrated, a rectangular electrode 43 is mounted at the side devoid of the GND electrode 35, and is connected with the internal resonant conductor 34.

In this case, intended as the side electrode in SMD application, the electrode 43 is to have an electrode width corresponding to a length from the bottom of the low dielectric layer 36-1 to the top of the low dielectric layer 36-2. To prevent the electrode 43 from contacting the circumferential GND electrode 35, blank areas 44 (without a conductor) are provided at the peripheral the electrode 43 (at the top side and bottom side).

As described above, in addition to the aforementioned effects of the present invention, the fourth and fifth embodiments provide following effects.

(1) Since the resonant conductor as a $\lambda/4$ type resonator is embedded completely in the high dielectric layers, the wavelength can be shortened to $\lambda/4\sqrt{\epsilon_r}$, and therefore the dielectric resonator can be reduced in size accordingly.

(2) Since the low dielectric layers are placed between the high dielectric layers and the GND electrode, even if the thickness in the laminated direction is made thin, the C component (capacitance component) is prevented from increasing. As a result, the Q is prevented from deteriorating.

Description of a sixth embodiment

Figure 10:
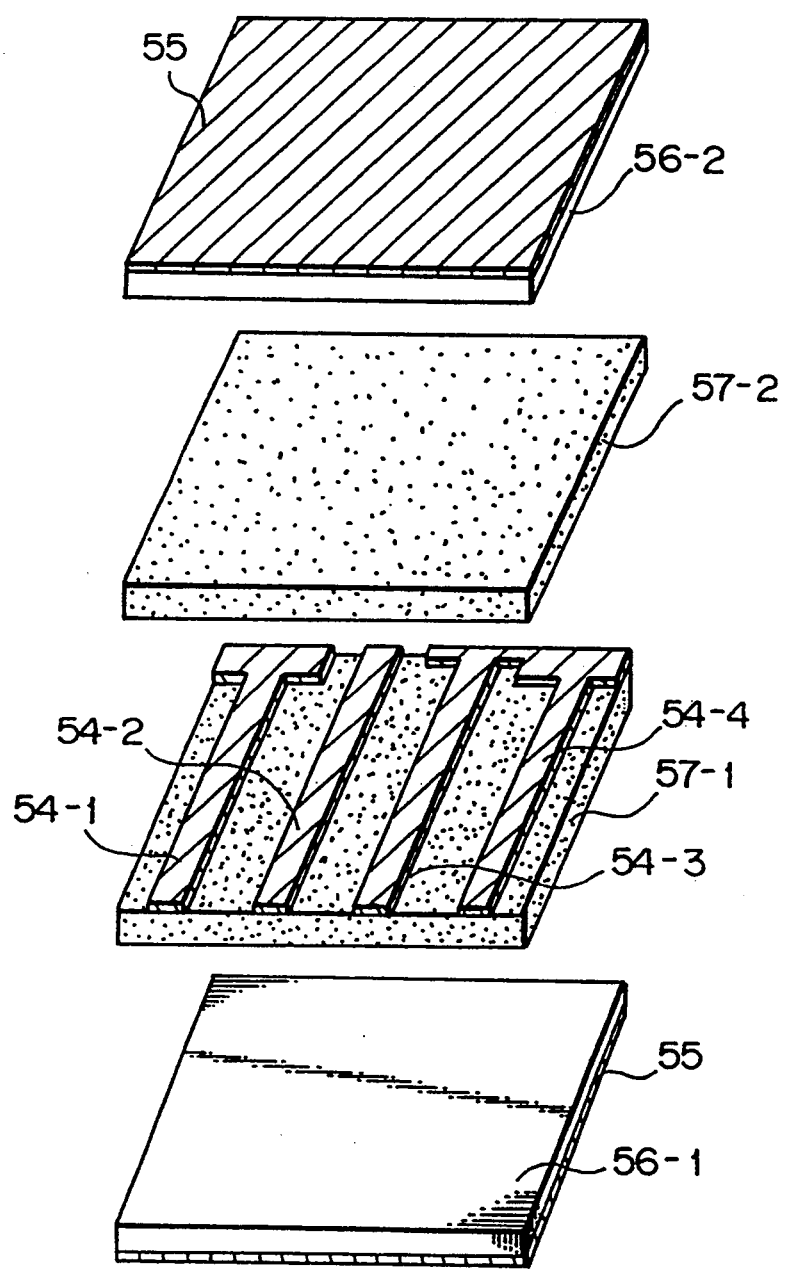
FIG. 10 is an exploded view in perspective of the dielectric filter according to the sixth embodiment of the present invention.
Figure 11A:
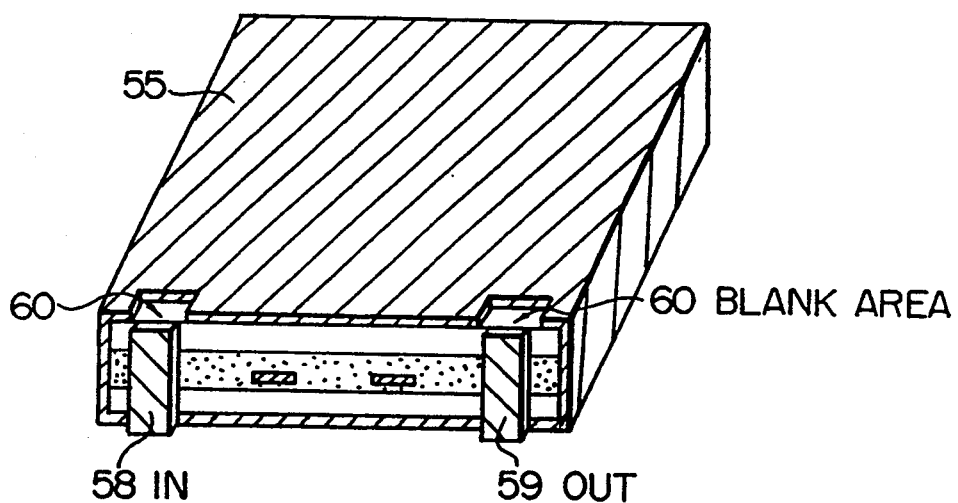
FIGS. 11A and 11B are perspective views of the dielectric filter according to the sixth embodiment of the present invention.
Figure 11B:
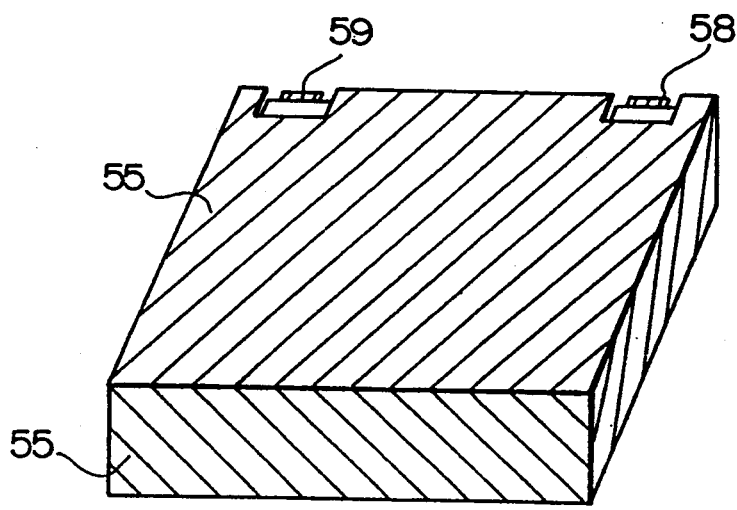

FIG. 10 and FIGS. 11A to 11B are diagrams showing a sixth embodiment, in which FIG. 10 is an exploded view in perspective of a dielectric filter, while FIGS. 11A and 11B are perspective views of a dielectric filter (FIG. 11A is a view taken from the front side, and FIG. 11B is a view taken from the back side). In those figures, reference numeral 54-1 to 54-4 denote $\lambda/4$ type resonant conductors, 55 denotes a GND electrode, 56-1 and 56-2 denote low dielectric layers, 57-1 and 57-2 denote high dielectric layers, 58 denotes an input terminal, 59 denotes an output terminal, and 60 denotes blank areas.

As seen from those figures, the dielectric filter (band pass filter) in the sixth embodiment has four resonant conductors.

As illustrated, the high dielectric layer (dielectric constant $\epsilon_1$) 57-1 is laminated on the low dielectric layer (dielectric constant $\epsilon_2$) 56-1. In this case, the relation $\epsilon_1 > \epsilon_2$ holds.

The four resonant conductors 54-1, 54-2, 54-3, and 54-4 are arranged specified distances apart from one another on the mentioned high dielectric layer 57-1. Those resonant conductors 54-1 to 54-4 differ in length, and therefore, differ in the resonance frequency, too.

One end of each of the resonant conductors 54-1 to 54-4 (the ends where those conductors are wide in FIG. 10) is on the GND side, and the opposite ends thereof are on the signal input side.

On the high dielectric layer 57-1 having the resonant conductors 54-1 to 54-4 mounted thereon, the high dielectric layer (dielectric constant $\epsilon_1$) 57-2 is laminated, so that the resonant conductors 54-1 to 54-4 are sandwiched by the high dielectric layers 57-1 and 57-2.

Then, on the above-mentioned high dielectric layer 57-2, the low dielectric layer (dielectric constant $\epsilon_2$) 56-2 is laminated. GND electrodes 55 are provided both on the upper side of the low dielectric layer 56-2 and on the under side of the low dielectric layer 56-1.

By executing the steps mentioned above, the dielectric filter is constituted in such a structure that the resonant conductors 54-1 to 54-4 are sandwiched by the high dielectric layers 57-1 and 57-2 (on both sides of the laminated direction), and the layers 57-1 and 57-2 are further sandwiched by the low dielectric layers 56-1 and 56-2. The all sides of the laminated body, except for one side used as a signal input side, are covered with the GND electrode 55, and the signal input side is provided with the input terminal (IN) 58 and the output terminal (OUT) 59.

In this example, as shown in FIGS. 11A and 11B, the input terminal 58 and the output terminal 59 are made of a conductor with a length substantially equal to the thickness of the laminated body, so that part of the GND electrode 55 surrounding those terminals are cut off to form the blank areas (areas without any conductor) 60. If the dielectric filter is structured as described, the input terminal 58 and the output terminal 59 can be prevented from contacting the GND electrode 55. By providing these terminals, the dielectric filter can be made ready for SMD (Surface Mounted Device) application.

Description of a seventh embodiment

Figure 12:
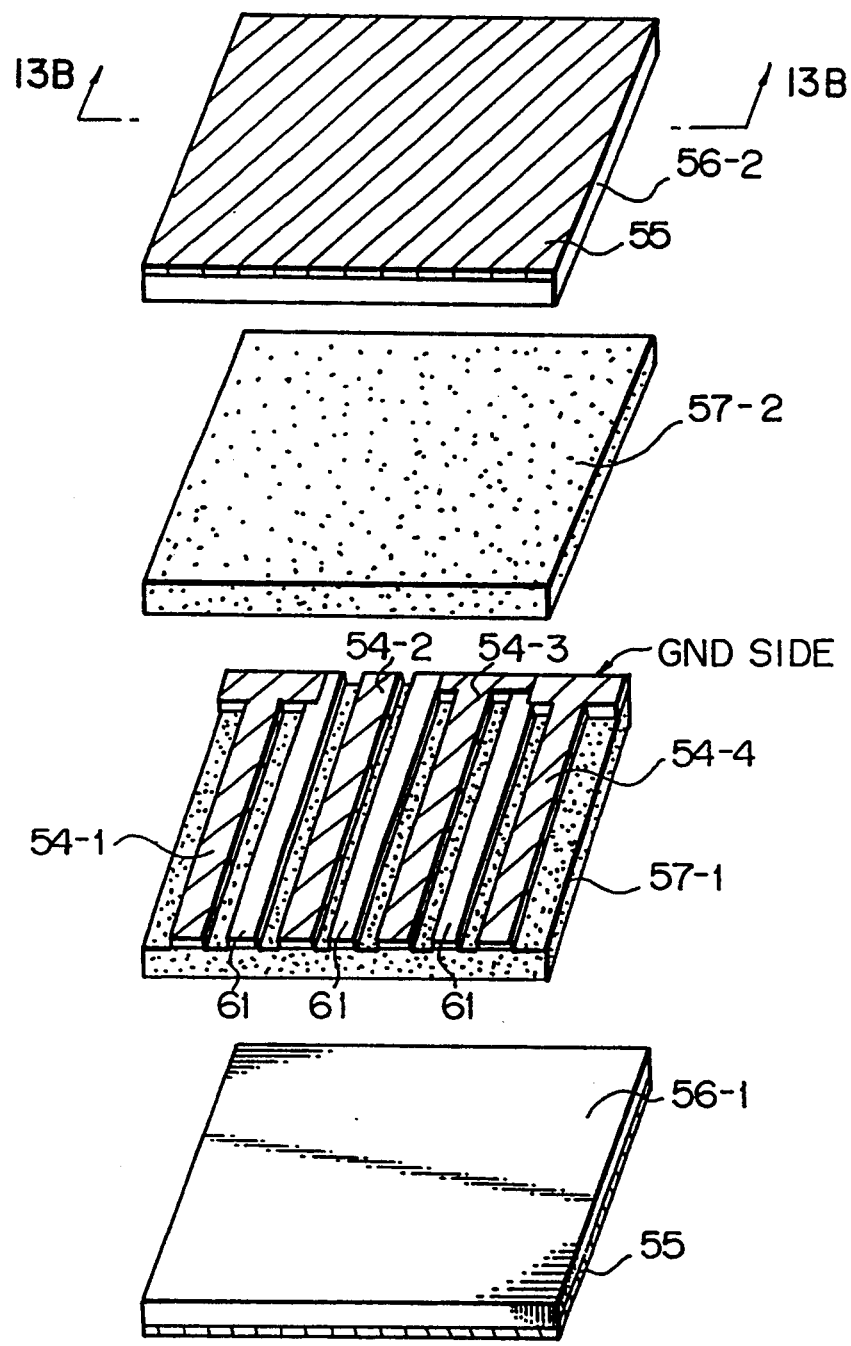
FIG. 12 is an exploded view in perspective of the dielectric filter according to a seventh embodiment of the present invention.
Figure 13A:
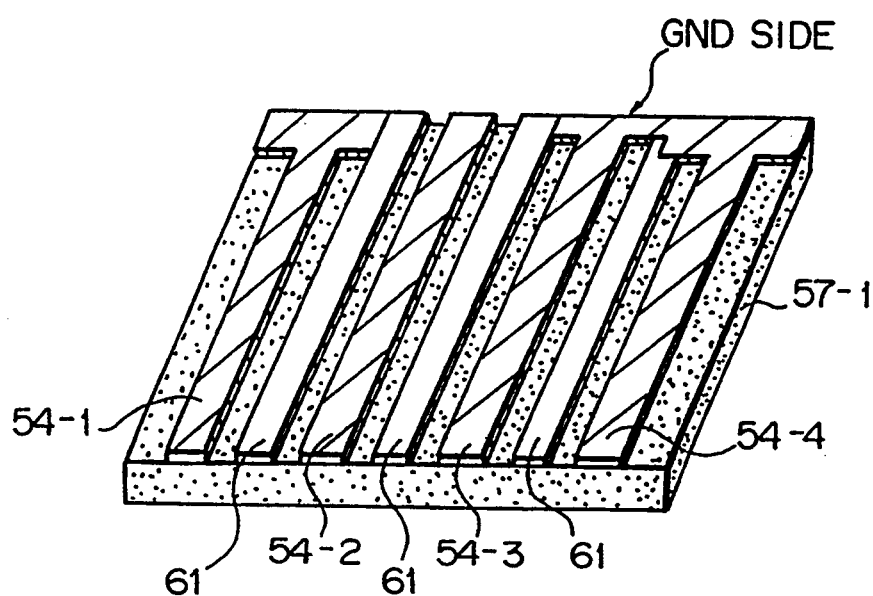
FIGS. 13A and 13B are structure diagrams of the dielectric filter according to the seventh embodiment.
Figure 13B:
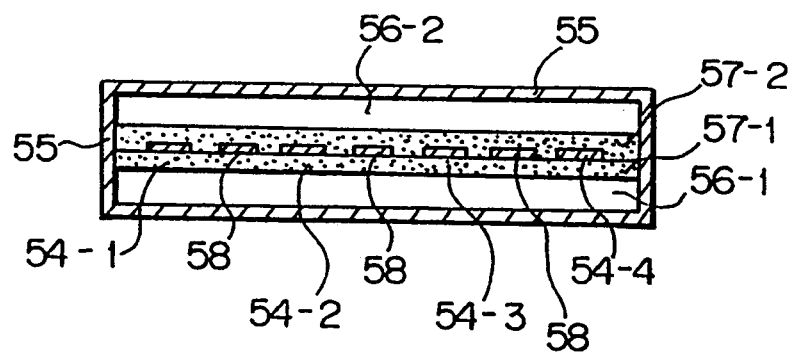

FIG. 12 and FIGS. 13A and 13B show a seventh embodiment, in which FIG. 12 is an exploded view in perspective of a dielectric filter, and FIGS. 13A and 13B are structural diagrams of the dielectric filter (FIG. 13A is a partially enlarged view, and FIG. 13B a sectional view taken along the line X-Y of FIG. 13A). In these figures, the same reference numerals as in FIG. 10 to 11B denote the same parts. Reference numeral 61 denotes low dielectric parts.

This seventh embodiment is a case in which low dielectric parts are placed between a plurality of resonant conductors so as to adjust the degree of coupling between the resonators.

As illustrated, on a low dielectric layer (dielectric constant $\epsilon_2$) 56-1, a high dielectric layer (dielectric constant $\epsilon_1$) 57-1 is laminated, and on this high dielectric layer 57-1, four resonant conductors 54-1, 54-2, 54-3, and 54-4 are formed. Low dielectric members (dielectric constant $\epsilon_2$) 61 are formed in respective spaces between the resonant conductors 54-1 to 54-4, by printing or sticking them in sheet form.

On the high dielectric layer 57-1, a high dielectric layer (dielectric constant $\epsilon_1$) 57-2 is laminated, and on which in turn a low dielectric layer 56-2 (dielectric constant $\epsilon_2$) is laminated.

A GND electrode 55 is provided on the under side of the low dielectric layer 56-1 and on the upper side of the low dielectric layer 56-2. The GND electrode 55 is also attached to the whole circumferential surface of the thus formed laminated body except for one side (the input side of the resonant conductor).

The degree of coupling between the resonators is adjusted by varying the shape of the low dielectric parts 61 provided between each of the resonant conductors.

The manufacturing process of the above-mentioned dielectric filter is described below. The manufacturing process will be described briefly.

Step 1: the dielectric parts constituting low dielectric layers 56-1 and 56-2 and high dielectric layers 57-1 and 57-2 shown in FIG. 12 are prepared.

Step 2: resonant conductors 54-1 to 54-4 and GND electrodes 55 are formed on the respective layers by printing.

Step 3: low dielectric parts 61 are formed by printing on the high dielectric layer 57-1 on which the resonant conductors 54-1 to 54-4 have been formed in step 2. In this case, the low dielectric parts 61 are formed a fixed distance separated from the resonant conductors.

Step 4: the layers which have gone through the steps 1 to 3 are laminated with each other, and the laminated body is subjected to a heat press process.

Step 5: binder removal process is performed, and the laminated body is calcined.

Step 6: electrodes are formed on a side face of the laminated body.

Step 7: the electrodes are baked.

By the step 1 to step 7, a dielectric filter is completed. The GND electrode as the outermost layer may be formed in the step 6.

Description of an eighth embodiment

Figure 14:
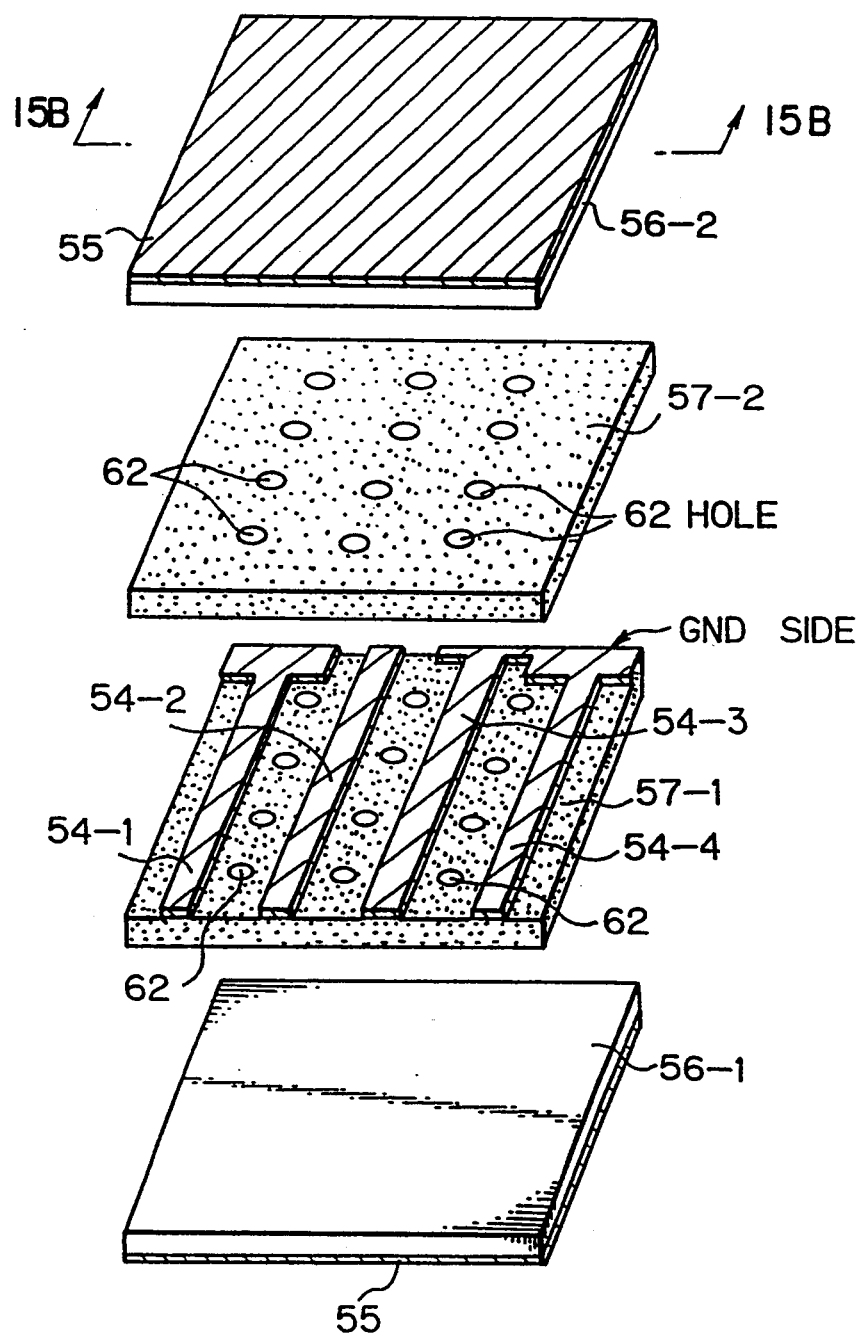
FIG. 14 is an exploded view in perspective of the dielectric filter in an eighth embodiment of the present invention.
Figure 15A:
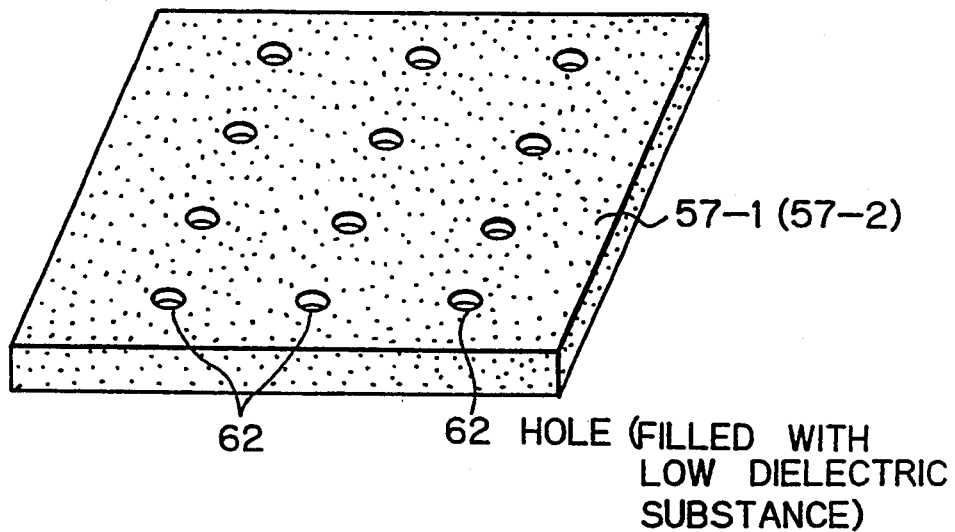
FIGS. 15A and 15B are structure diagrams of the dielectric filter according to the eighth embodiment of the present invention.
Figure 15B:
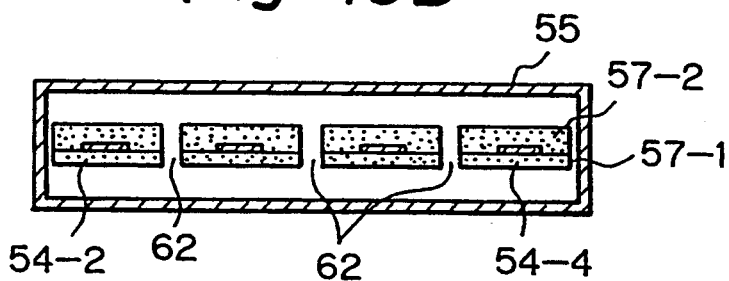

FIG. 14 is an exploded view in perspective of a dielectric filter according to an eight embodiment. FIGS. 15A and 15B are structural diagrams of the dielectric filter according to the eighth embodiment, in which FIG. 15A is a perspective view of a high dielectric layer, while FIG. 15B is a sectional view taken along the line S-T in FIG. 14. In these figures, the same reference numerals as in FIGS. 10 to 13B denote the same parts. Reference numeral 62 denotes through-holes.

The eighth embodiment is a case in which a plurality of holes are opened in the high dielectric layers, and the holes are filled with a low dielectric substance so that the low dielectric substance lie between the resonant conductors to thereby adjust the degree of coupling between the resonators.

In this embodiment, a low dielectric layer 56-1, high dielectric layers 57-1 and 57-2, and a low dielectric layer 56-2 are laminated as illustrated. The arrangement of the dielectric layers and the structure of resonant conductors 54-1 to 54-4, and a GND electrode 55 are the same as that in the sixth embodiment.

In the eighth embodiment, the through-holes are opened by punching the high dielectric layers 57-1 and 57-2, and the through-holes are filled with a low dielectric substance. The holes 62 opened in the high dielectric layers 57-1 and 57-2 are positioned so that they are arranged between the resonant conductors 54-1 to 54-4 when the layers are laminated.

In this case, the dielectric constant of the low dielectric substance filled in the holes 62 is to be $\epsilon_2$ ($\epsilon_1 > \epsilon_2$) as in the low dielectric layers 56-1 and 56-2, for example.

The process of manufacturing the dielectric filter is given below. The manufacturing process will be described briefly.

Step 1: dielectric parts for low dielectric layers 56-1 and 56-2, and high dielectric layers 57-1 and 57-2 are prepared. Through-holes 62 are formed by punching the high dielectric layers 57-1 and 57-2.

Step 2: resonant conductors 54-1 to 54-4, and GND electrodes 55 are formed by printing on the dielectric layers 57-1, 56-1, and 56-2, respectively.

Step 3: the holes 62 in the high dielectric layers 57-1 and 57-2 are filled with a low dielectric substance by printing or the like.

Step 4: the layers which have undergone the step 1 to step 3 are laminated, then subjected to a heat press process.

Step 5: binder removal and calcining process are performed.

Step 6: electrodes are attached to the side face, and the GND electrodes may be formed on the layers 56-1 and 56-2 by this step 6.

Step 7: the electrodes are baked.

By the process of step 1 to step 7, a dielectric filter is completed. In this embodiment, the degree of coupling between the resonators is adjusted by the size and the number of the holes 62.

The low dielectric parts which are formed by being filled in the holes 62 on the high dielectric layer 57-1 in FIG. 14, may be filled in the holes 62 simultaneously with forming (by printing or the like) of the low dielectric strips 61 arranged between the resonant conductors as shown in FIG. 13A.

The sixth to eighth embodiments can be modified as described below.

(1) The resonant conductors are not limited to four as in the above-mentioned embodiments, but may be any number except one.

(2) The resonant conductors may be provided in multiple layers with the interposition of high dielectric layers. For example, in the above-mentioned embodiments, a high dielectric layer of the same structure as the high dielectric layer 57-1 having the resonant conductors 54-1 to 54-4 formed thereon may be laminated on the under side of the high dielectric layer 57-1. This makes it possible to reduce the loss of the resonant conductors.

(3) The resonant conductors may be formed in the shapes shown in FIGS. 6A to 6F.

(4) In the above-mentioned embodiments, one end of each of the resonant conductors is connected to the GND electrode. To reinforce the connection with the GND electrode, a blind through-hole (filled with a conductor) may be formed in the dielectric layers, so that by using the blind through-hole conductor, the end portion of each resonant conductor is connected to the GND electrode at the bottom side or the top side of the laminated body.

(5) In the above-mentioned embodiments, each of the low dielectric layers 56-1 and 56-2 is not limited to one layer, but may be formed in multiple layers. Also, each of the high dielectric layers 57-1 and 57-2 is not limited to one layer, but may be formed in multiple layers.

(6) The external shape of the dielectric filter is not limited to a prismatic shape, but may be in any shape.

As described above, in addition to the aforementioned effects of the present invention, the sixth to eighth embodiments offers the following effects.

(1) As a plurality of resonant conductors are contained completely in the dielectric (high dielectric layers), the wavelength can be shortened to $\lambda/4\sqrt{\epsilon_1}$. Therefore, the dielectric resonator can be made in a reduced size accordingly.

(2) Since the low dielectric layer is placed between the GND electrode and the high dielectric layer, even if the thickness in the laminated direction is made thin, the C component (capacitance component) does not increase causing Q to be prevented from lowering.

(3) Since the dielectric filter is formed by lamination of dielectric parts, the resonant conductor can be formed in any shape by printing or the like. Thus, the resonant conductors can be freely designed.

(4) As the laminated body can be formed with reduced thickness, the time for binder removal and calcining can be shortened.

(5) The process of metallizing the walls of the throughhole can be done away with, and the manufacturing process can be made simpler.

Description of a ninth embodiment

Figure 16:
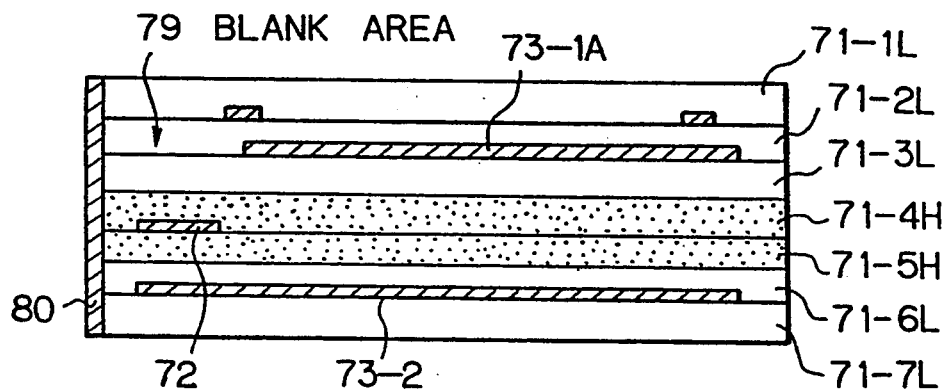
FIG. 16 is a sectional view of a voltage control oscillator (VCO) according to a ninth embodiment of the present invention.
Figure 17A:
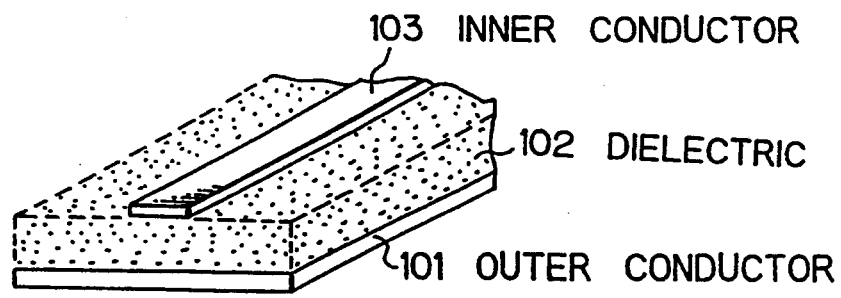
FIGS. 17A to 17C are diagrams showing a prior-art example 1 (high frequency transmission line)
Figure 17B:
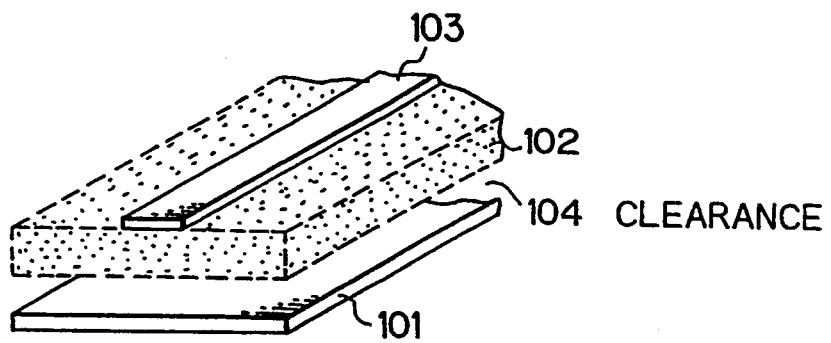
Figure 17C:
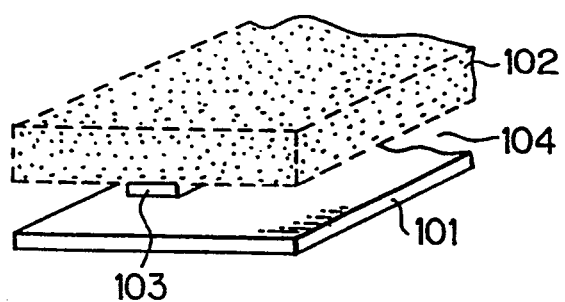
Figure 18A:
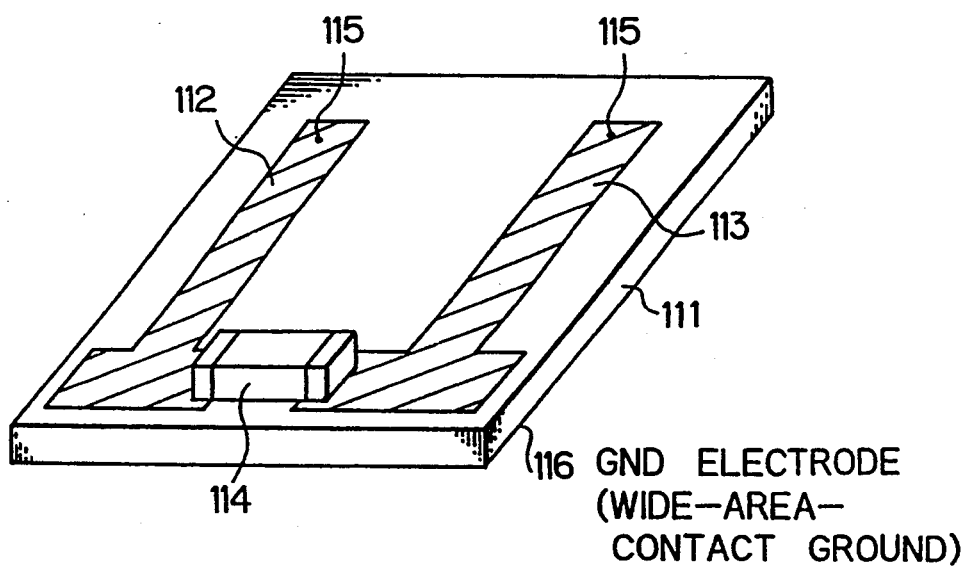
FIGS. 18A and 18B are diagrams showing a prior-art example 2 (high frequency filter)
Figure 18B:
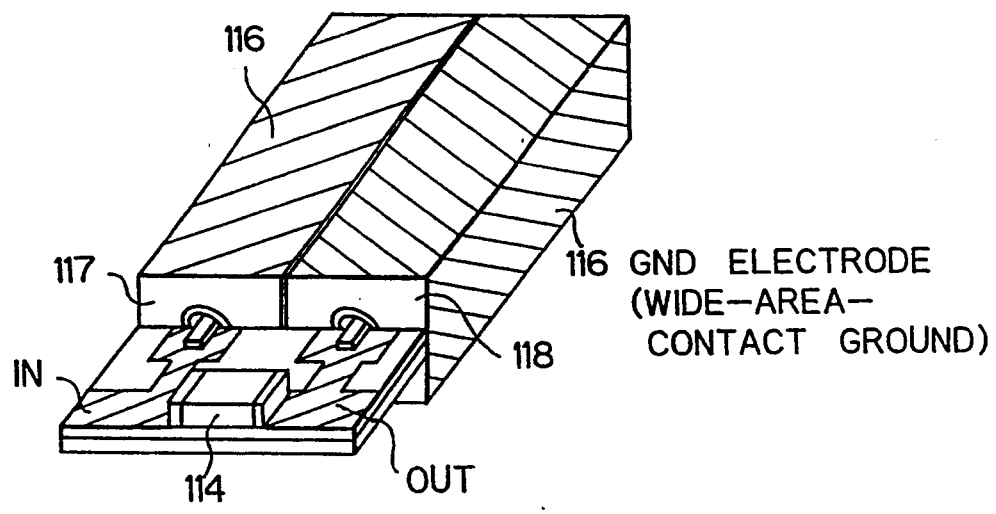
Figure 19A:
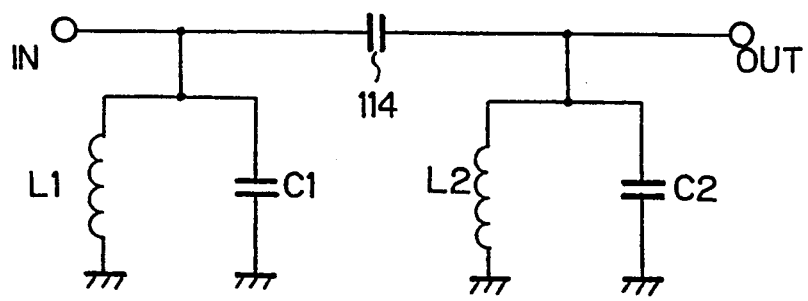
FIGS. 19A to 19C show equivalent circuit diagrams of the prior-art example 2.
Figure 19B:
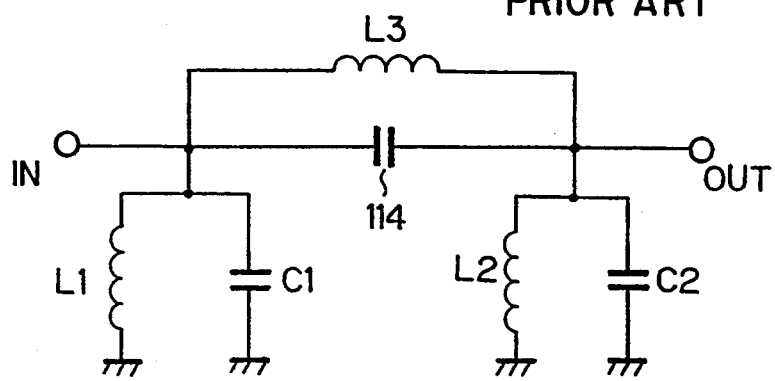
Figure 19C:
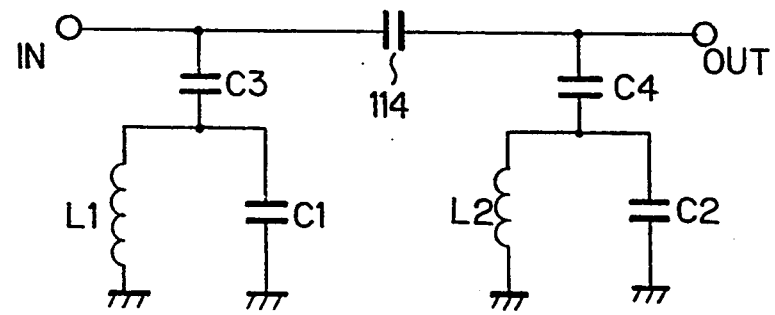
Figure 20A:
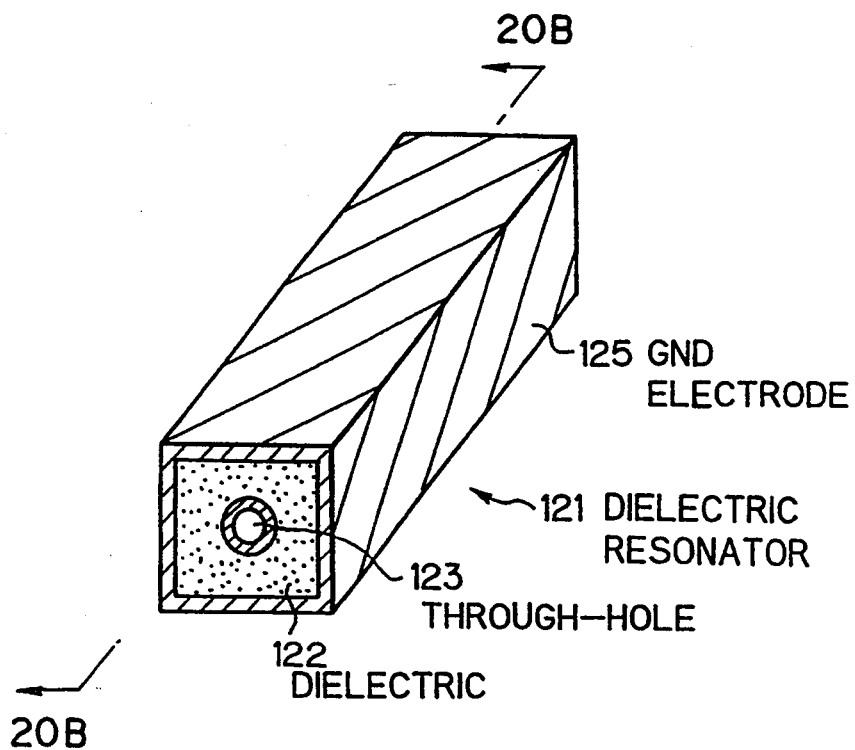
FIGS. 20A and 20B are diagrams showing a prior-art example 3 (dielectric resonator)
Figure 20B:
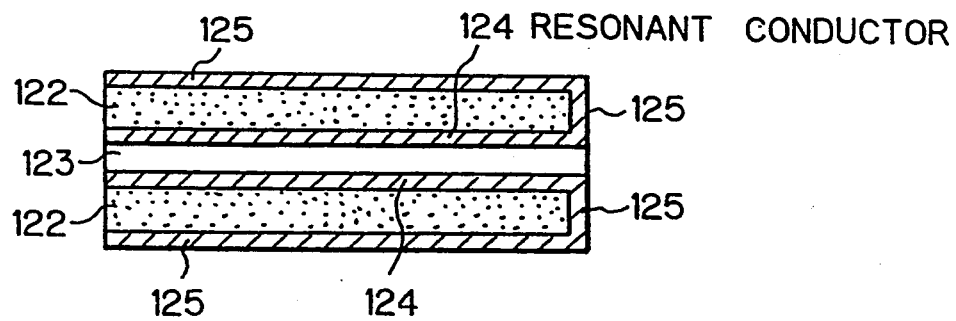
Figure 21A:
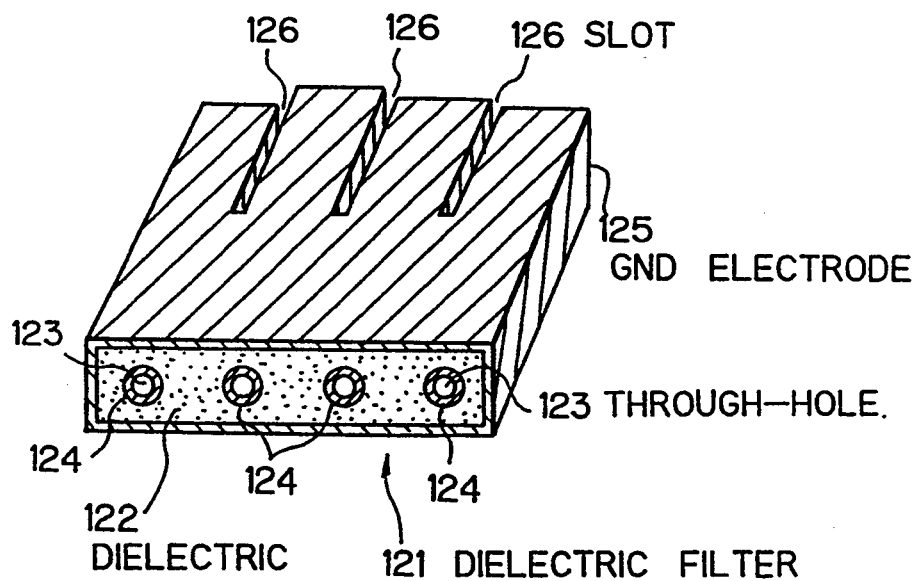
FIGS. 21A and 21B are diagrams showing a prior-art example 4 (dielectric filter)
Figure 21B:
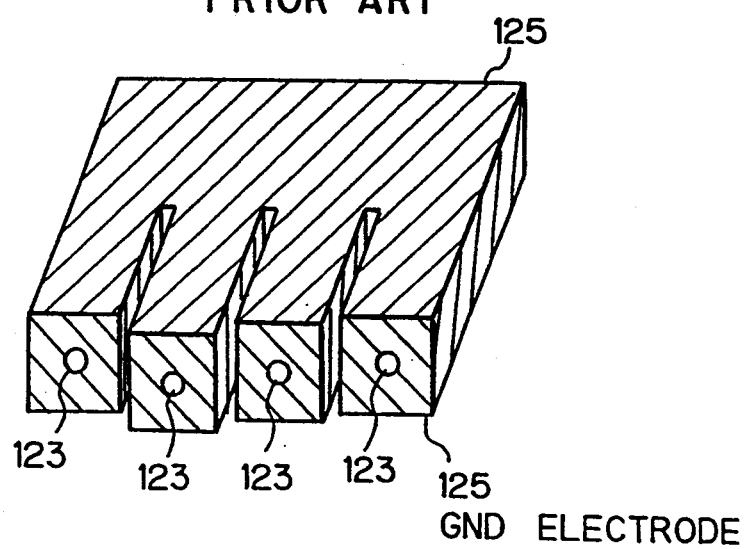
Figure 22A:
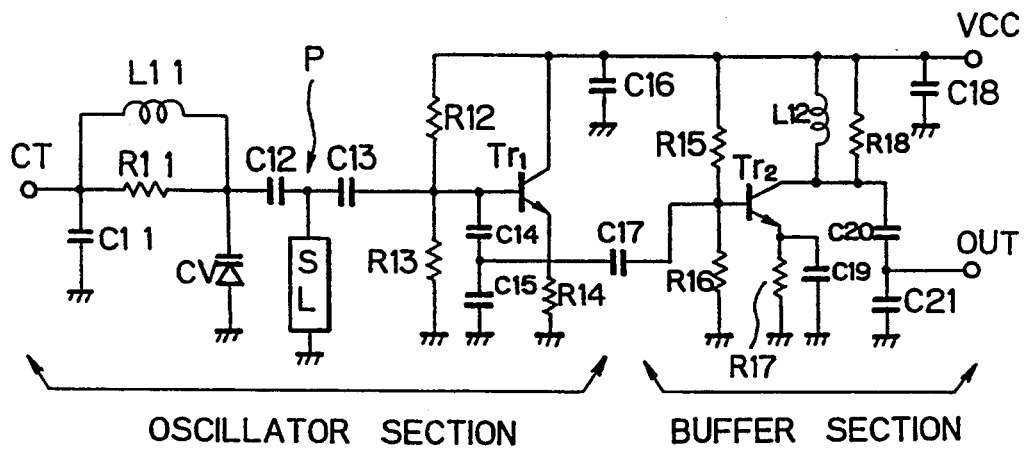
FIGS. 22A to 22C are diagrams showing a prior-art example 5 (voltage control oscillator)
Figure 22B:
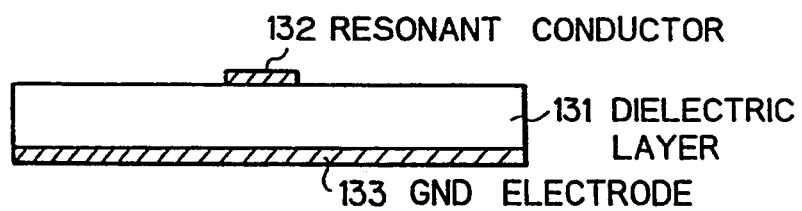
Figure 22C:
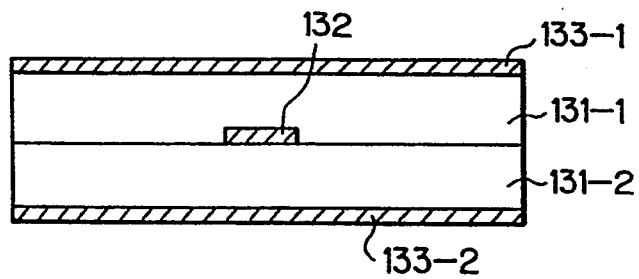
Figure 23A:
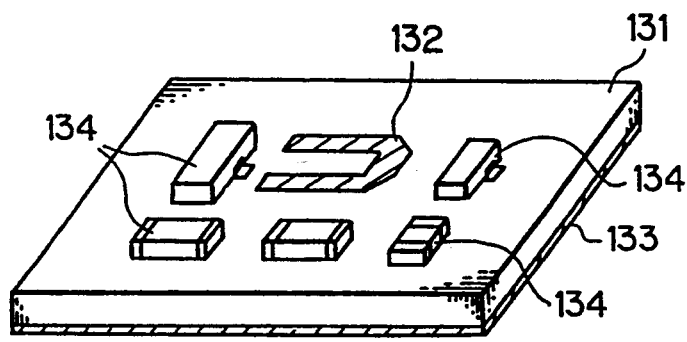
FIGS. 23A and 23B show prior-art examples of VCO module.
Figure 23B:
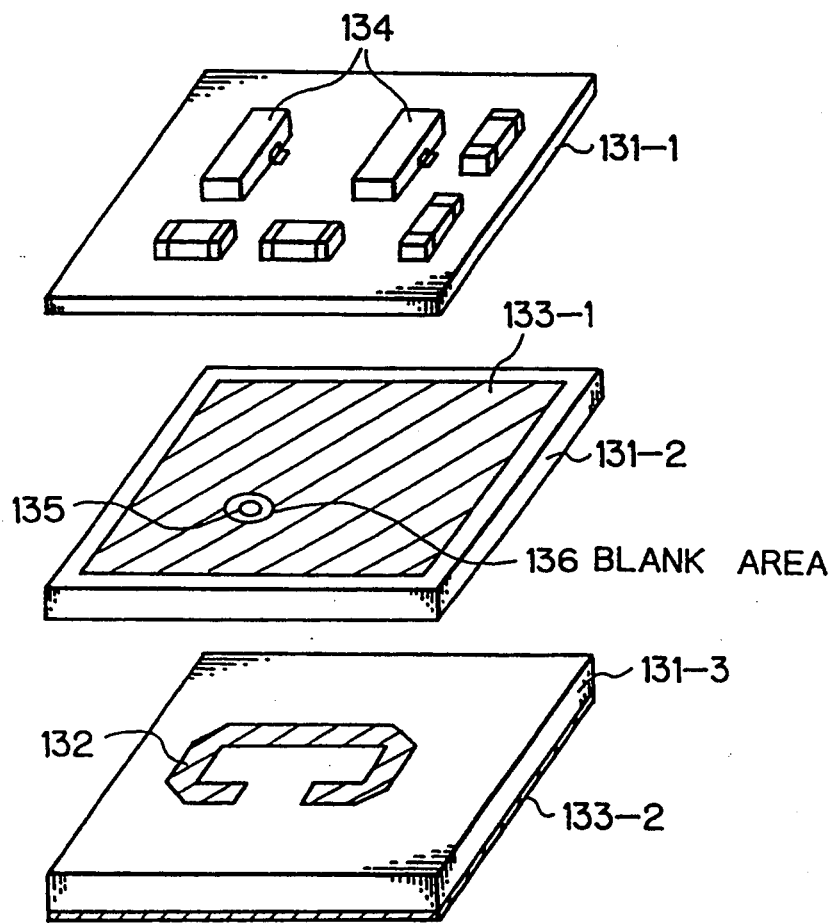

FIG. 16 is a sectional view of the voltage control oscillator (VC0) in a ninth embodiment. In the figure, reference numerals 71-1L to 71-3L, and 71-6L and 71-7L denote low dielectric layers, 71-4H and 71-5H denote high dielectric layers, 73-1A and 73-2 denote GND electrodes, 72 denotes resonant conductor (strip line resonator), 79 denotes a blank area (without conductor) and 80 denotes side-face electrode.

The ninth embodiment is a voltage control oscillator (VCO) formed by using a resonant conductor (strip line resonator) corresponding to the inner conductor in the first embodiment and connecting other parts thereto. For a VCO module, a resonator is mounted in the substrate on which discrete parts are mounted, and in order to obtain a thin substrate, a structure described below is used.

A multi-layer substrate is formed by the first to seventh dielectric layers 71-1L, 71-2L, 71-3L, 71-4H, 71-5H, 71-6L, and 71-7L.

The voltage control oscillator (VC0) is composed of an oscillator section and a buffer section. This buffer section serves to protect the oscillator against adverse effects from voltage fluctuation and so on the output side of the VCO. When mounting the oscillator section and the buffer section, they are arranged separately.

As illustrated, transistors and other discrete parts are mounted on the first dielectric layer (low dielectric) 71-1L of the multi-layer substrate, while a coil and a wiring pattern are formed on the second dielectric layer (low dielectric) 71-2L (by solid printing).

The GND pattern 73-1A is formed (by solid printing) on the whole surface, except for the blank area (area without conductor) 79, of the third dielectric layer (low dielectric layer) 71-3L. The resonant conductor 72 is formed (by printing a conductor paste) on the fifth dielectric layer (high dielectric layer) 71-5H.

Furthermore, the GND pattern (wide-area-contact GND pattern) 73-2 is formed (in solid printing) on the seventh dielectric layer 71-7L.

The above-mentioned patterns are extended by conductor patterns to the end of the dielectric layers, and connected to the GND electrode 80 formed on the GND side face for SMD (Surface Mounted Device) application.

The GND pattern 73-1A may be constituted so as to cover the resonant conductor 72. However, in order for the low dielectric layers 71-3L and 71-6L to be designed to be particularly thin (to obtain a thin substrate), it is desirable to form the blank area 79 as shown in FIG. 16. The above-mentioned blank area 79 is made to have substantially the same shape as the resonant conductor 72 (somewhat larger than this), and formed above the resonant conductor 72. In other words, when the dielectric layers are laminated, the GND pattern 73-1A is prevented from being present above (in the laminated direction) the resonant conductor 72. Namely, the GND pattern 73-1A is formed by patterning on the low dielectric layer 71-3L with the blank area 79 left as blank.

In an oscillator, the resonant conductor is used as a mere inductive element, and hence, there is no problem of radiation loss. Therefore, the resonant conductor need not be mounted in a tri-plate structure.

One end, in the GND side, of the resonant conductor 72 is extended to the end of the fifth dielectric layer 71-5H and connected to the GND electrode 80 (not illustrated as it is in FIG. 16), while the other end is connected to a capacitor (a discrete part in this case) mounted on the surface of the substrate, for example.

The strip line resonator is structured such that the GND pattern 73-2 is formed under the resonant conductor 72 with interposition of a dielectric layer, whereas no GND pattern is formed but only dielectric layers are formed above the resonant conductor 72. Also, this resonator is disposed at peripheral (including under side) of a transistor of the oscillator section mounted on the surface of the substrate.

Thus, the resonant conductor 72 of the strip line resonator is placed between the high dielectric layers 71-4H and 71-5H, thereby shortening the wavelength. Consequently, a resonator with high Q can be obtained, and the oscillator section, particularly the strip line resonator, is protected against adverse effects from the buffer section.

In the VCO module structured as above-described, the strip line resonator can be adjusted as follows. A trimming GND pattern (not shown) is formed on the low dielectric layer 71-1L just above a part of the strip line resonator 72, which part is not connected to the GND electrode 80, and connected to the GND electrode 73-1A. Then, the trimming GND pattern is trimmed. Since when trimming, a capacitance component between the resonant conductor 72 and the trimming GND pattern is varied, the resonance frequency of the strip line resonator can be adjusted.

The above-mentioned ninth embodiment can be modified as described below.

(1) This embodiment can be applied not only to the VCO module but also to other oscillators.

(2) Any of elements, such as resistors, coils, and capacitors, constituting an oscillator, can be formed by a thick film pattern.

(3) In the ninth embodiment, no GND pattern is provided at all at a higher position of the laminated body which faces the resonant conductor. However, this invention does not exclude applications in which a part of the GND pattern slightly overlaps with the resonant conductor for reasons of pattern design or pattern displacement in the manufacturing process.

As described above, in addition to the aforementioned effects of the present invention, the ninth embodiment offers the following effects.

(1) When the low dielectric layers 71-3L and 71-6L are designed to have a thin thickness to reduce the thickness of the substrate, because of the absence of GND pattern above the resonant conductor, the C component can be made small. As a result, a large line impedance can be obtained causing Q of the resonator to be made high.

(2) Since the dielectric layers are provided above and below the resonant conductor (both sides), the wavelength shortening of $\lambda/\sqrt{\epsilon_r}$ can be expected, and the series resistance component ($r_s$) of the resonant conductor can be made small causing Q of the resonator to be made high. Therefore, an oscillator module in small size and with high Q can be obtained.

(3) Even if the dielectric layers of the substrate is made thin, the C component can be set at a small value, and therefore, the Q of the transmission line can be prevented from lowering.

(4) Since the substrate can be made thin, time for binder removal step and baking step in calcining the substrate can be shortened, which contributes to a reduction of substrate production cost.

(5) Even if the resonant conductor is mounted in a multi-layer substrate, the resonant frequency can be adjusted easily.

Industrial Applicability

High frequency devices according to the present invention can be applied to high frequency transmission lines such as a high frequency signal line or a delay line, high frequency filters, high frequency oscillators, and resonators, and other devices.

I claim:

1. A high frequency device comprising:
a multi-layer substrate constructed by laminating a plurality of dielectric layers, each with different dielectric constants;
at least one inner conductor, acting as a signal transmission line for propagating a high frequency signal, provided inside said multi-layer substrate; and
outer conductors for providing a ground potential,
wherein top and bottom surfaces of said at least one inner conductor are sandwiched by first dielectric layers formed of a dielectric material with a first dielectric constant, top and bottom surfaces of said first dielectric layers are sandwiched by second dielectric layers formed of a dielectric material with a second dielectric constant which is lower than said first dielectric constant, and outer surfaces of said second dielectric layers are sandwiched by said outer conductors.

2. A high frequency filter comprising:
a laminated body constructed by laminating at least first, second, third and fourth dielectric layers;
first and second resonant conductors being formed at intervals of a predetermined distance between said second and third dielectric layers, said first and second resonant conductors being located inside said laminated body, said first and second resonant conductors acting as strip line resonators in signal transmission lines for propagating high frequency signals;
GND electrode patterns formed, at intervals of a predetermined distance, on lateral sides of said first and second resonant conductors; and
GND electrodes being formed on outer surfaces of said first and fourth dielectric layers,
wherein said second and third dielectric layers are made of a material with a first dielectric constant, and the first and fourth dielectric layers are made of a material with a second dielectric constant which is lower than said first dielectric constant of said second and third dielectric layers.

3. A high frequency filter comprising:
a laminated body constructed by laminating at least first, second, third, fourth, fifth, sixth, seventh and eighth dielectric layers;
a first GND electrode being formed on an outer surface of said first dielectric layer;
a first resonant conductor being formed between the second and third dielectric layers, said second and third dielectric layers being located below the first GND electrode;
first GND electrode patterns being formed at intervals of a predetermined distance on lateral sides of said first resonant conductor;
a second GND electrode being formed between the fourth and fifth dielectric layers, said fourth and fifth dielectric layers located below said third dielectric layer;
a second resonant conductor being formed between the sixth and seventh dielectric layers, said sixth and seventh dielectric layers formed below said fifth dielectric layer, said first and second resonant conductors acting as strip line resonators in signal transmission lines for propagating high frequency signals;
second GND electrode patterns being formed at intervals of a predetermined distance on lateral sides of said second resonant conductor; and
a third GND electrode being formed on an outer surface of said eighth dielectric layer, said eighth dielectric layer is formed below said seventh dielectric layer,
wherein the second, third, sixth and seventh dielectric layers, which are formed on top and bottom surfaces of the respective first and second resonant conductors, are made of a material with a first dielectric constant and the first, fourth, fifth and eighth dielectric layers are made of a material with second dielectric constant lower than said first dielectric constant.

4. A dielectric resonator comprising:
a laminated dielectric block constructed by laminating a plurality of second dielectric layers and a plurality of first dielectric layers;
at least one resonant conductor formed inside the dielectric block, said at least one resonant conductor acting as at least one strip line resonator in at least one signal transmission line for propagating at least one high frequency signal; and
a GND electrode being formed on an entire external circumferential surface of the dielectric block except for one side surface thereof,
wherein the plurality of first dielectric layers are formed on top and bottom surfaces of said at least one resonant conductor, and the plurality of second dielectric layers are formed on outer surfaces of said first dielectric layers, said first dielectric layers having first dielectric constants which are higher than second dielectric constants of the second dielectric layers.

5. A dielectric filter comprising:
a laminated body constructed by laminating a plurality of first dielectric layers and a plurality of second dielectric layers, said second dielectric layers having a second dielectric constant higher than a first dielectric constant of the first dielectric layers;
a plurality of resonant conductors acting as strip line resonators having different resonance frequencies, said resonant conductors formed inside the laminated body; and
a GND electrode provided on an entire external circumferential surface of the laminated body except for one side surface thereof,
wherein the plurality of second dielectric layers are formed on top and bottom surfaces of said plurality of resonant conductors, the plurality of first dielectric layers are formed on outer surfaces of the second dielectric layers.

6. A dielectric filter according to claim 5, wherein between lateral sides of said plurality of resonant conductors, first dielectric strips are formed, respectively, said first dielectric strips have a dielectric constant lower than said second dielectric constant of the second dielectric layers which are formed on top and bottom surfaces of the plurality of resonant conductors.

7. A dielectric filter according to claim 5, wherein a plurality of holes are formed in the second dielectric layers which are disposed on top and bottom surfaces of the resonant conductors, said holes are formed at positions corresponding to areas between the resonant conductors, and the holes are filled with a dielectric having a dielectric constant lower than said second dielectric constant of said second dielectric layers.

8. An oscillator module comprising:
   a resonant conductor constructed of a strip line resonator acting as a signal transmission line for propagating a high frequency signal;
   a plurality of first dielectric layers sandwiching top and bottom surfaces of the resonator conductor, said first dielectric layers having a first dielectric constant;
   a plurality of second dielectric layers sandwiching outer surfaces of the first dielectric layers, said second dielectric layers having a second dielectric constant which is lower than said first dielectric constant; and
   a plurality of GND patterns being formed between surfaces of the second dielectric layers except for a certain part,
   wherein a first GND pattern of said plurality of GND patterns is located beneath the resonator conductor, and at least two other of said plurality of second dielectric layers are formed on an upper side of the resonant conductor and at a portion of said at least two other of said plurality of second dielectric layers having none of said GND patterns formed thereon.

* * * * *